United States Patent
Lee et al.

(10) Patent No.: US 12,041,831 B2
(45) Date of Patent: Jul. 16, 2024

(54) DISPLAY APPARATUS

(71) Applicant: SAMSUNG DISPLAY CO., LTD., Yongin-si (KR)

(72) Inventors: Sunhwa Lee, Yongin-si (KR); Hyeongseok Kim, Yongin-si (KR); Youngwan Seo, Yongin-si (KR); Gyungsoon Park, Yongin-si (KR); Mukyung Jeon, Yongin-si (KR); Kyunghoon Chung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/446,429

(22) Filed: Aug. 8, 2023

(65) Prior Publication Data

US 2023/0389382 A1  Nov. 30, 2023

Related U.S. Application Data

(63) Continuation of application No. 17/352,719, filed on Jun. 21, 2021, now Pat. No. 11,723,248.

(30) Foreign Application Priority Data

Aug. 10, 2020 (KR) ........................ 10-2020-0099938

(51) Int. Cl.
*H10K 59/131* (2023.01)
*H10K 59/121* (2023.01)
(Continued)

(52) U.S. Cl.
CPC ......... *H10K 59/131* (2023.02); *H10K 59/121* (2023.02); *H10K 59/122* (2023.02); *H10K 59/88* (2023.02); *H10K 59/35* (2023.02)

(58) Field of Classification Search
CPC ........................ H10K 59/121; H10K 59/131
See application file for complete search history.

(56) References Cited

U.S. PATENT DOCUMENTS 10,134,826 B2    11/2018   Ka et al.
10,236,333 B2    3/2019    Kim
(Continued)

FOREIGN PATENT DOCUMENTS

KR    10-2017-0066767 A    6/2017
KR    10-2017-0117291 A    10/2017
KR    10-2018-0025431 A    3/2018

*Primary Examiner* — Douglas M Menz
(74) *Attorney, Agent, or Firm* — Lewis Roca Rothgerber Christie LLP

(57) ABSTRACT

A display apparatus having a display area enlarged to display an image in an area where a component is arranged includes a substrate including a first area having a transmission portion, and a second area surrounding the first area, a first data line extending in a first direction on the second area, and including a first line and a second line spaced from each other with the first area therebetween, a connection line on the second area, adjacent to, and bypassing, the first area, and including an end connected to the first line, and another end connected to the second line, a pixel circuit on the second area, including a thin-film transistor, and a node connection line electrically connected to the thin-film transistor, and a first pixel electrode above the pixel circuit, wherein the connection line is spaced from the node connection line.

20 Claims, 17 Drawing Sheets

(51) Int. Cl.
  *H10K 59/122* (2023.01)
  *H10K 59/88* (2023.01)
  *H10K 59/35* (2023.01)

(56) References Cited

U.S. PATENT DOCUMENTS

| | | |
|---|---|---|
| 10,304,913 B2 | 5/2019 | Choi et al. |
| 11,011,595 B2 | 5/2021 | Lee et al. |
| 11,335,764 B2 | 5/2022 | Her et al. |
| 11,507,151 B2 | 11/2022 | Choi et al. |
| 11,538,888 B2 | 12/2022 | Jeon et al. |
| 11,581,514 B2 | 2/2023 | Kim et al. |
| 2021/0391408 A1* | 12/2021 | Lee ..................... H10K 59/121 |

* cited by examiner

DISPLAY APPARATUS

CROSS-REFERENCE TO RELATED APPLICATIONS

This application is a continuation of U.S. patent application Ser. No. 17/352,719, filed Jun. 21, 2021, which claims priority to and the benefit of Korean Patent Application No. 10-2020-0099938, filed Aug. 10, 2020, the entire content of both of which is incorporated herein by reference.

BACKGROUND

1. Field

One or more embodiments relate to a display apparatus in which a display area is increased so as to display an image in an area in which a component is arranged.

2. Description of Related Art

Recently, the usage of display apparatuses has diversified. For example, display apparatuses have become thinner and lighter, and thus, the uses of display apparatuses have expanded.

As display apparatuses are used for various purposes, there may be various methods of designing shapes of display apparatuses, and functions that may be connected to, or associated with, display apparatuses have increased.

SUMMARY

One or more embodiments include a method of increasing functions, which may be combined with, or connected to, a display apparatus. The display apparatus may include a first area in which a component, such as a sensor or a camera, is arranged, wherein the first area is provided in a display area. However, these are merely examples, and do not limit the scope of the disclosure.

Additional aspects will be set forth in part in the description that follows and, in part, will be apparent from the description, or may be learned by practice of the presented embodiments of the disclosure.

According to one or more embodiments, a display apparatus includes a substrate including a first area having a transmission portion, and a second area surrounding the first area, a first data line extending in a first direction on the second area, and including a first line and a second line spaced from each other with the first area therebetween, a connection line on the second area, adjacent to, and bypassing, the first area, and including an end connected to the first line, and another end connected to the second line, a pixel circuit on the second area, including a thin-film transistor, and a node connection line electrically connected to the thin-film transistor, and a first pixel electrode above the pixel circuit, wherein the connection line is spaced from the node connection line.

The connection line may be at a different layer from the first data line.

The connection line may be above the first data line.

The display apparatus may further include a pixel-defining layer covering an edge of the first pixel electrode, and having an opening exposing a central portion of the first pixel electrode, wherein the connection line passes between the opening and the node connection line.

The display apparatus may further include a pixel-defining layer covering an edge of the first pixel electrode, and having an opening exposing a central portion of the first pixel electrode, wherein the connection line overlaps the opening.

The connection line may overlap a central portion of the opening.

The display apparatus may further include a first intermediate layer including a green emission layer on the first pixel electrode.

The display apparatus may further include a dummy line on the second area and spaced from the connection line.

The dummy line may have a mesh form.

The dummy line may be configured to receive a driving voltage.

The dummy line and the connection line may be continually arranged on the entire surface of the second area, wherein the dummy line and the connection line are disconnected from each other on at least a portion of the second area, and are electrically disconnected from each other.

The display apparatus may further include a second pixel electrode on the second area, wherein the connection line does not overlap the second pixel electrode.

The display apparatus may further include a second intermediate layer on the second pixel electrode, wherein the second intermediate layer includes a red emission layer or a blue emission layer.

The connection line may at least partially overlap the first pixel electrode, and may be bent on a plane at least twice to not overlap the second pixel electrode.

The display apparatus may further include a dummy line on the second area, spaced from the connection line, at least partially overlapping the first pixel electrode, and bent on a plane at least twice to not overlap the second pixel electrode.

The pixel circuit may include a first thin-film transistor including a semiconductor layer, a gate electrode at least partially overlapping the semiconductor layer, and an electrode layer above the gate electrode and electrically connected to the semiconductor layer, a storage capacitor including a lower electrode including the gate electrode, and an upper electrode on the lower electrode, and a connecting metal above the electrode layer, and electrically connecting the electrode layer with the first pixel electrode, wherein the first data line includes the same material as the electrode layer, and wherein the connection line includes the same material as the connecting metal.

The pixel circuit may further include a second thin-film transistor, wherein an end of the node connection line contacts the gate electrode, and wherein another end of the node connection line contacts the second thin-film transistor.

The first thin-film transistor may include a driving thin-film transistor, wherein the second thin-film transistor includes a compensation thin-film transistor.

The display apparatus may further include a second data line extending in the first direction, spaced from the first data line, and passing through the first area and the second area.

The display apparatus may further include an auxiliary pixel on the first area, and connected to the second data line.

The display apparatus may further include a third data line extending on the second area in the first direction, and at least partially overlapping the connection line.

According to one or more embodiments, a display apparatus includes a substrate including a first area, and a second area surrounding the first area, a first pixel and a second pixel on the second area and arranged in a first direction with the first area therebetween, a data line extending on the second area in the first direction, and including a first line connected to the first pixel, and a second line connected to the second pixel, and a connection line on the second area, having an end connected to the first line, and another end connected to the second line, and at a different layer than the data line.

The display apparatus may further include a first thin-film transistor, a second thin-film transistor, and a node connection line electrically connecting the first thin-film transistor with the second thin-film transistor, and not overlapping the connection line, the first thin-film transistor, the second thin-film transistor, and the node connection line being at the second area.

BRIEF DESCRIPTION OF THE DRAWINGS

The above and other aspects of embodiments of the disclosure will be more apparent from the following description taken in conjunction with the accompanying drawings, in which.

DETAILED DESCRIPTION

Figure 1:
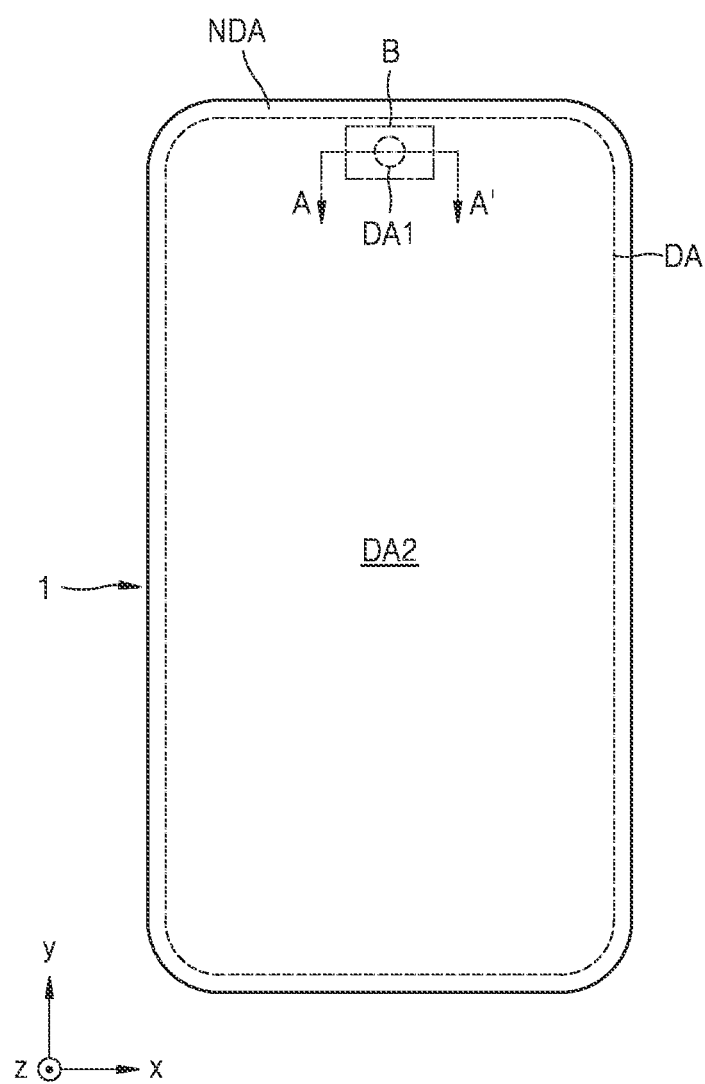
FIG. 1 is a schematic plan view of a portion of a display apparatus according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic plan view of a portion of a display apparatus 1 according to some embodiments.

Referring to FIG. 1, the display apparatus 1 may include a display area DA and a peripheral area NDA outside the display area DA. The display area DA may include a first area DA1, which may be defined as an auxiliary display area or a component area, and a second area DA2 that may be defined as a main display area and that at least partially surrounds the first area DA1. That is, each of the first area DA1 and the second area DA2 may separately or together display an image. The peripheral area NDA may correspond to a type of non-display area in which display elements are not arranged. The display area DA may be generally surrounded by the peripheral area NDA.

FIG. 1 illustrates that one first area DA1 is located in the second area DA2. According to other embodiments, the display apparatus 1 may include two or more first areas DA1, wherein the first areas DA1 may have different shapes and sizes from each other. When the first area DA1 is seen from a direction that is approximately perpendicular to an upper surface of the display apparatus 1 (e.g., in a plan view), the first area DA1 may have various shapes, such as a polygonal shape including a square shape, a hexagonal shape, an octagonal shape, etc., a circular shape, an oval shape, a star shape, a diamond shape, or the like.

Also, FIG. 1 illustrates that the first area DA1 is arranged at an upper center side (for example, in a +y direction) of the display area DA having an approximately quadrangular shape having rounded edges when seen from the direction approximately perpendicular to the upper surface of the display apparatus 1. However, the first area DA1 may be arranged at a side of the display area DA, for example, an upper right side or an upper left side.

Figure 2:
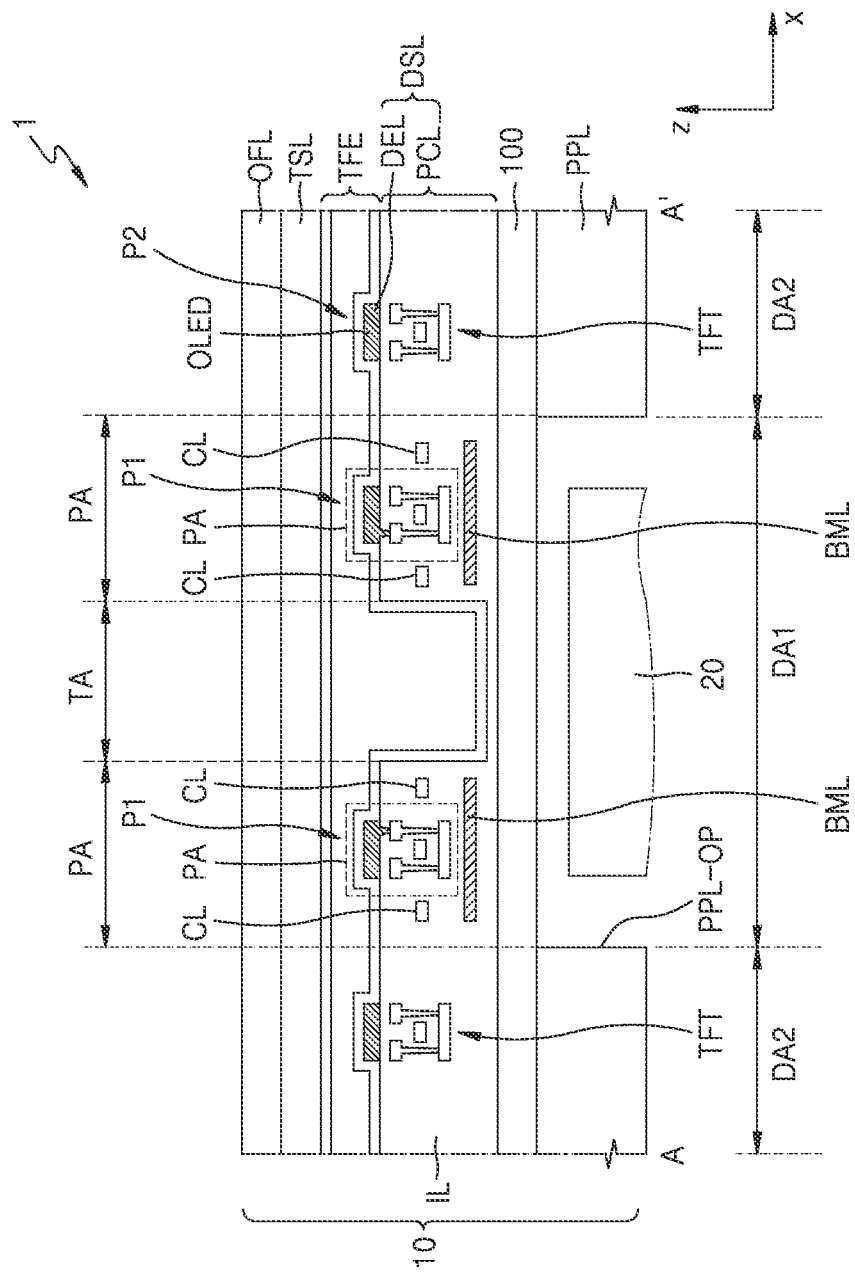
FIG. 2 is a schematic cross-sectional view of a portion of a display apparatus taken along the line A-A' of FIG. 1, according to some embodiments.

As described below with reference to FIG. 2, the first area DA1 may include a pixel area PA (FIG. 2) and a transmission portion TA (FIG. 2). Each of the pixel area PA and the transmission portion TA may be provided in a plural number, and the pixel area PA and the transmission portion TA may be alternatively arranged. A pixel may be arranged in the pixel area PA. However, a pixel might not be arranged in the transmission portion TA. The transmission portion TA may correspond to an area in which arrangement of components included in a display layer DSL (FIG. 2) is reduced or minimized. Also, light may be transmitted through the transmission portion TA through a substrate 100.

The display apparatus 1 may provide an image by using a first pixel P1 arranged in the first area DA1, and a second pixel P2 arranged in the second area DA2.

As described below with reference to FIG. 2, a component 20 (FIG. 2), which is an electronic element, may be arranged below a display panel 10 or a portion thereof in the first area DA1. The component 20 may include a camera using infrared rays or visible rays, and may include a capturing device. Alternatively, the component 20 may include a solar battery and/or solar panel, a flash device, an illuminance sensor, a proximity sensor, an iris sensor, etc. Alternatively, the component 20 may have a function to receive sound. To avoid the restriction of functions of the component 20 to the extent possible, the first area DA1 may include the transmission portion TA through which light and/or sound may pass through, the light and/or the sound being output from the component 20 to the outside, or progressing toward the component 20 from the outside.

According to some embodiments, when light is transmitted through the first area DA1, a light transmittance may be about 10% or greater, for example, about 40% or greater, about 25% or greater, about 50% or greater, about 85% or greater, or about 90% or greater.

Hereinafter, an organic light-emitting display apparatus is described as an example of the display apparatus 1 according to some embodiments. However, other embodiments are not limited thereto. As another example, the display apparatus 1 according to some embodiments may include an inorganic light-emitting display apparatus, an inorganic electroluminescent (EL) display apparatus, or a quantum dot light-emitting display apparatus. For example, an emission layer of a display element included in the display apparatus 1 may include an organic material, an inorganic material, a quantum dot, an organic material and a quantum dot, or an inorganic material and a quantum dot.

FIG. 2 is a schematic cross-sectional view of a portion of the display apparatus 1 according to some embodiments. FIG. 2 corresponds to the portion of the display apparatus 1 taken along the line A-A' of FIG. 1.

Referring to FIG. 2, the display apparatus 1 may include the display panel 10, and the component 20 arranged to overlap the display panel 10. A cover window for protecting the display panel 10 may further be arranged above the display panel 10 in other embodiments.

The display panel 10 may include the first area DA1, which is an area overlapping the component 20, and the second area DA2 in which a main image is displayed. When seen from a direction that is approximately perpendicular to an upper surface of the display apparatus 1 (e.g., in a plan view), a width and/or an area of the first area DA1 may be greater than a width and/or an area of the component 20.

The display apparatus 1 may provide an image by using an auxiliary pixel, that is, the first pixel P1 (FIG. 2), which is arranged in the first area DA1, and a main pixel, that is, the second pixel P2 (FIG. 2), which is arranged in the second area DA2.

The display panel 10 may include the substrate 100, a display layer DSL, a touch screen layer TSL, an optical functional layer OFL, and a panel protection layer PPL that is arranged below the substrate 100.

The substrate 100 may include an insulating material, such as glass, quartz, polymer resins. The substrate 100 may include a rigid substrate or a flexible substrate, which may be bent, folded, or rolled. According to some embodiments, the substrate 100 may have a multi-layered structure, and may include at least one organic layer and at least one inorganic layer.

The substrate 100 may include glass, metal, or polymer resins. In the case where the substrate 100 is flexible, the substrate 100 may include polymer resins, such as polyethersulphone, polyacrylate, polyetherimide, polyethylene naphthalate, polyethylene terephthalate, polyphenylene sulfide, polyarylate, polyimide, polycarbonate, or cellulose acetate propionate.

The display layer DSL may include a pixel circuit layer PCL including a thin-film transistor TFT, and/or a display element layer DEL including an organic light-emitting diode OLED as a display element. Some embodiments of the display layer DSL may include an encapsulation member, such as a thin-film encapsulation layer TFE or an encapsulation substrate.

The first and second pixels P1 and P2 including the thin-film transistors TFT, and including the organic light-emitting diodes OLED connected to the thin-film transistors TFT, may be arranged in the display layer DSL corresponding to the display area DA.

The first pixel P1 including the thin-film transistor TFT and the organic light-emitting diode OLED may be arranged in the first area DA1. The first pixel P1 in the first area DA1 may denote, for example, a sub-pixel. Thus, at least one first pixel P1 may be arranged in the pixel area PA. FIG. 2 illustrates that one first pixel P1 is included in each pixel area PA. However, a plurality of first pixels P1 may be included in each pixel area PA in other embodiments. Conductive layers electrically connecting the first pixels P1 in adjacent pixel areas PA may be located around the pixel area PA. The conductive layers may correspond to at least one of a data line DL, a driving voltage line PL, a scan line SL, an emission control line EL, a previous scan line SL−1, a next scan line SL+1, and an initialization voltage line VL to be described below with reference to FIG. 6A or 6B.

The transmission portion TA in which a display element is not arranged may be located between the pixel areas PA of the first area DA1. The transmission portion TA may be an area through which the light/signal emitted from the component 20 or the light/signal incident into the component 20 is transmitted.

At least a portion of an insulating layer IL corresponding to the transmission portion TA may be removed, while a remaining portion may be arranged on the transmission portion TA. As described above, light transmittance of the transmission portion TA may be improved by removing a portion of the insulating layer IL in an area corresponding to the transmission portion TA. At the same time, by having the remaining portion of the insulating layer IL remain on the transmission portion TA, outgas generated from the substrate 100 may be prevented from being flown into the display layer DSL. Thus, the reliability of the organic light-emitting diode OLED may be increased. This aspect will be described in detail below.

The component 20 may be located in the first area DA1. The component 20 may include an electronic element using light or sound. For example, the component 20 may include a sensor configured to receive and use light, such as an infrared sensor, a sensor configured to output and sense light or sound to measure a distance or recognize a fingerprint, etc., a small-sized lamp configured to output light, a speaker configured to output sound, or a camera including an imaging device. An electronic element using light may use lights of various wavelength ranges, such as visible rays, infrared rays, ultraviolet rays, etc.

According to some embodiments, a plurality of components 20 may be arranged in the first area DA1. In this case, the plurality of components 20 may have different functions from one another. For example, the plurality of components 20 may include at least two of a camera or imaging device, a solar battery, a flash device, a proximity sensor, an illuminance sensor, and an iris sensor.

A back metal layer BML may be arranged in the first area DA1. The back metal layer BML may be arranged to correspond to each pixel area PA. The back metal layer BML may reduce or prevent external light, for example, light emitted from the component 20, that would otherwise reach the first pixel P1. Also, light reflection or diffraction occurring when external light is transmitted through the conductive layers may be reduced or prevented through the back metal layers BML, and thus, image distortion (for example, flare, haze, etc.) in the first area DA1 may be reduced or prevented.

According to some embodiments, a constant voltage or a signal may be applied to the back metal layer BML to reduce or prevent the likelihood of damage to a pixel circuit otherwise caused by an electrostatic discharge. According to other embodiments, the back metal layers BML arranged to correspond to different pixel areas PA may receive different voltages.

The thin-film encapsulation layer TFE may include at least one inorganic encapsulation layer, and at least one organic encapsulation layer. The thin-film encapsulation layer TFE may also be arranged on the transmission portion TA. In some embodiments, the encapsulation member encapsulating the display element layer DEL corresponds to the thin-film encapsulation layer TFE. However, the disclosure is not limited thereto. For example, an encapsulation substrate coupled to the substrate 100 by a sealant or frit may also be used as the encapsulation member for encapsulating the display element layer DEL.

The panel protection layer PPL may be coupled under the substrate 100 to support and protect the substrate 100. The panel protection layer PPL may include an opening PPL-OP corresponding to the first area DA1. Because the panel protection layer PPL may include the opening PPL-OP, light transmittance of the first area DA1 may be increased. The panel protection layer PPL may include polyethylene, terephthalate, or polyimide.

The first area DA1 may have a greater area than an area in which the component 20 is arranged. Accordingly, an area of the opening PPL-OP provided in the panel protection layer PPL may not correspond to the area of the first area DA1. For example, the area of the opening PPL-OP may be less than the area of the first area DA1.

The touch sensing layer TSL may obtain coordinate information based on an external input, for example, a touch event. The touch sensing layer TSL may include a touch electrode, and touch lines connected to the touch electrode. The touch sensing layer TSL may sense an external input based on a magnetic capacitance method or based on a mutual capacitance method. The touch sensing layer TSL may be directly formed on the thin-film encapsulation layer TFE. Alternatively, the touch sensing layer TSL may be separately formed on a touch substrate, and then may be coupled onto the thin-film encapsulation layer TFE through an adhesive layer, such as an optical clear adhesive (OCA).

The optical functional layer OFL may include a reflection prevention layer. The reflection prevention layer may reduce reflectivity of light (external light) incident toward the display apparatus 1 from the outside. For example, the optical functional layer OFL may include a polarization film. Alternatively, the optical functional layer OFL may include a filter plate including a black matrix and color filters.

In other embodiments, a cover window may be arranged above the display panel 10 to protect the display panel 10. The optical functional layer OFL may be coupled to the cover window or to the touch sensing layer TSL via an OCA.

Figure 3:
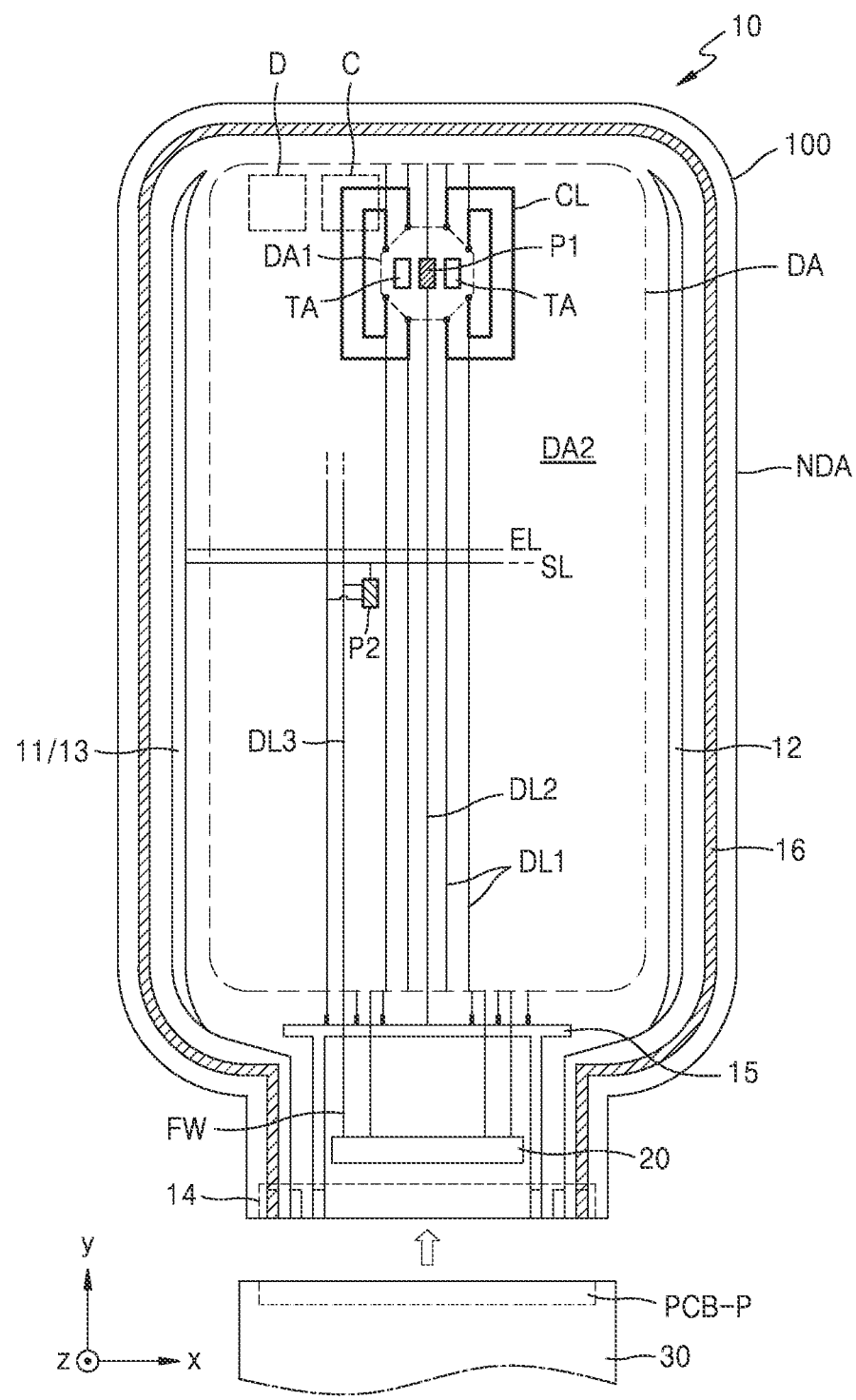
FIG. 3 is a schematic plan view of a display panel according to some embodiments.
Figure 4:
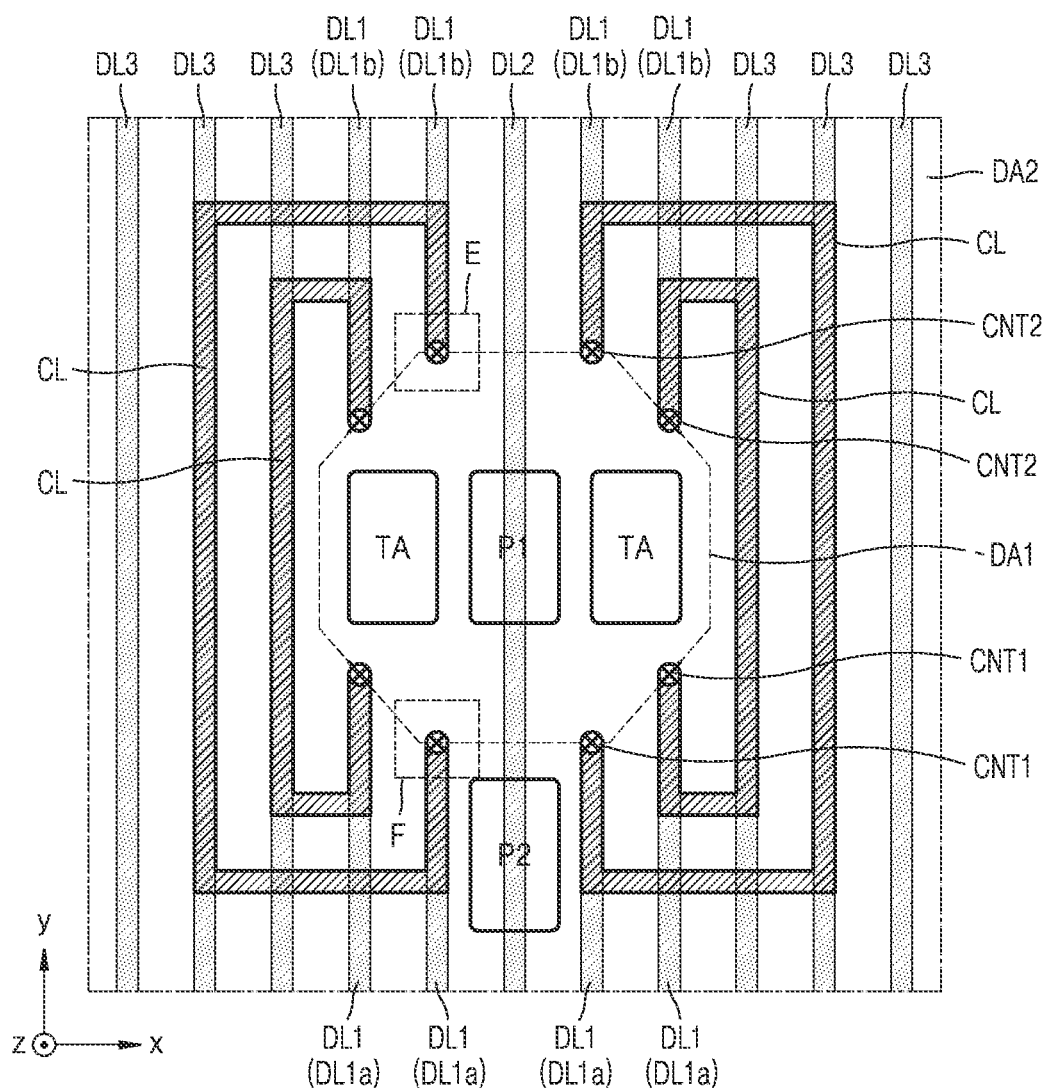
FIG. 4 is an enlarged plan view of a portion of a display apparatus, the portion corresponding to region B of FIG. 1, according to some embodiments.
Figure 5:
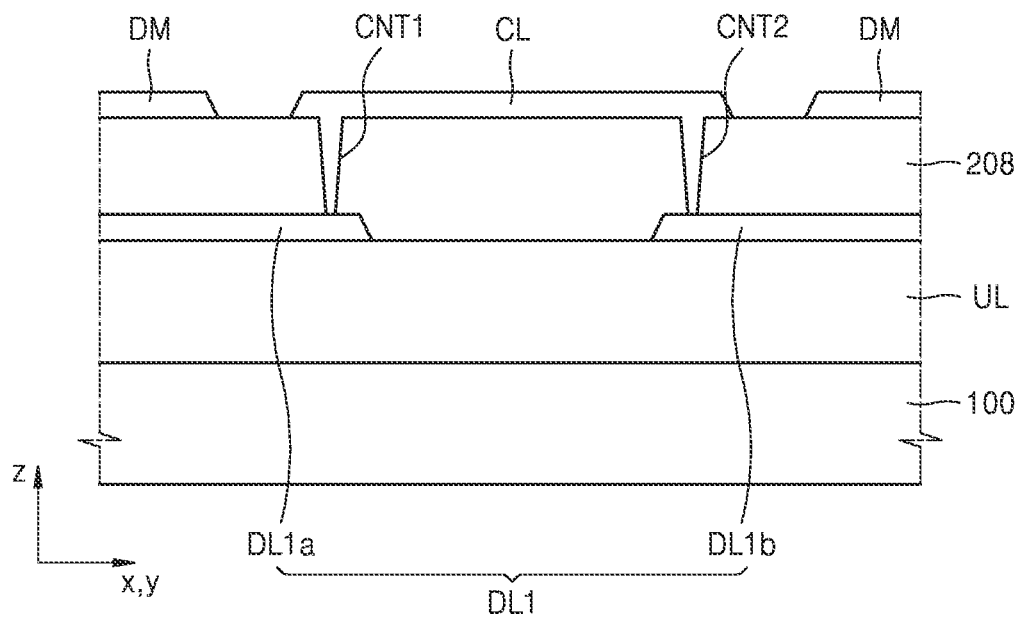
FIG. 5 is a schematic cross-sectional view showing an arrangement relationship of a first data line and a connection line.

FIG. 3 is a schematic plan view of the display panel 10 according to some embodiments, FIG. 4 is an enlarged plan view of a portion of the display apparatus 1 according to some embodiments, and FIG. 5 is a schematic cross-sectional view of an arrangement relationship of a first data line DL1 and a connection line CN. FIG. 4 corresponds to region B of FIG. 1.

Referring to FIG. 3, various components included in the display panel 10 may be arranged above the substrate 100. The substrate 100 may include the display area DA, and the peripheral area NDA surrounding at least a portion of the display area DA. The display area DA may include the first area DA1 defined as an auxiliary display area or a component area, and in which an auxiliary image is displayed, and also may include the second area DA2 defined as a main display area, in which a main image is displayed. The auxiliary image may form a general image along with the main image, or may form a separate image from the main image.

The first area DA1 may be arranged inside the display area DA and may be surrounded by the second area DA2, as illustrated in FIG. 3. FIG. 3 illustrates that the first area DA1 has an octagonal shape.

The plurality of first pixels P1 may be arranged in the first area DA1. Each first pixel P1 may denote a sub-pixel, and may be realized via a display element, such as an organic light-emitting diode OLED. The first pixel P1 may emit, for example, red, green, blue, or white light.

The first area DA1 may include the transmission portion TA. The transmission portion TA may be arranged to surround or partially surround at least one first pixel P1. Alternatively, the transmission portion TA may be arranged to form a grid shape with respect to at least one first pixel P1.

Because the first area DA1 has the transmission area TA, a resolution of the first area DA1 may be lower than a resolution of the second area DA2. For example, the resolution of the first area DA1 may be about any one of ½, ⅜, ⅓, ¼, 2/9, ⅛, 1/9, 1/16, etc. of the resolution of the second area DA2. For example, the resolution of the first area DA1 may be about 200 ppi or about 100 ppi, and the resolution of the second area DA2 may be about 400 ppi or higher.

The plurality of second pixels P2 may be arranged in the second area DA2. Each second pixel P2 may denote a sub-pixel, and may be realized via a display element, such as an organic light-emitting diode OLED. The second pixel P2 may emit, for example, red, green, blue, or white light.

Each of the first and second pixels P1 and P2 may be electrically connected to outer circuits arranged in the peripheral area NDA, which is a non-display area. A first scan driving circuit 11, a second scan driving circuit 12, an emission control driving circuit 13, a terminal 14, a first power supply line 15, and a second power supply line 16 may be arranged in the peripheral area NDA.

The first scan driving circuit 11 may provide a scan signal to each of the first and second pixels P1 and P2 through a scan line SL. The second scan driving circuit 12 may be arranged in parallel with the first scan driving circuit 11 with the display area DA therebetween. Some of the first and second pixels P1 and P2 arranged in the display area DA may be electrically connected to the first scan driving circuit 11, and others of the first and second pixels P1 and P2 may be electrically connected to the second scan driving circuit 12. According to other embodiments, the second scan driving circuit 12 may be omitted.

The emission control driving circuit 13 may be arranged at a side of the first scan driving circuit 11, and may provide an emission control signal to each of the first and second pixels P1 and P2 through an emission control line EL. FIG. 3 illustrates that the emission control driving circuit 13 is arranged only at a side of the display area DA. However, the emission control driving circuit 13 may be arranged at both sides of the display area DA (e.g., as the first and second scan driving circuits 11 and 12 or as a portion thereof).

The terminal 14 may be arranged at a side of the substrate 100. The terminal 14 might not be covered by an insulating layer, and may be exposed to be electrically connected to a printed circuit board PCB. A terminal PCB-P of the printed circuit board PCB may be electrically connected to the terminal 14 of the display panel 10.

In some embodiments, the printed circuit board PCB may transmit a signal or power of a controller to the display panel 10. A control signal generated by the controller may be transmitted to each of the first scan driving circuit 11, the second scan driving circuit 12, and the emission control driving circuit 13 through the printed circuit board PCB. Also, the controller may generate a data signal, and may transmit the generated data signal to the display area DA through a fanout line FW.

Also, the controller may provide a first power voltage ELVDD and a second power voltage ELVSS (e.g., see FIGS. 6A and 6B) to the first and second power supply lines 15 and 16, respectively. The first power voltage ELVDD (or a driving voltage) may be provided to each of the first and second pixels P1 and P2 through a driving voltage line PL connected to the first power supply line 15, and the second power voltage ELVSS (or a common voltage) may be provided to an opposite electrode of each of the first and second pixels P1 and P2 connected to the second power supply line 16. The first power supply line 15 may extend in an x direction below the second area DA2. The second power supply line 16 may have a loop shape having an open side, and may partially surround the display area DA in a plan view.

Referring to FIGS. 3 and 4, first through third data lines DL1, DL2, and DL3 extending in a first direction (for example, a y direction) and spaced apart from each other may be arranged on the display area DA. Each of the first through third data lines DL1, DL2, and DL3 may supply a data signal to the first and second pixels P1 and P2 of the display area DA.

The first data line DL1 may be disconnected (e.g., may have a first portion disconnected from a second portion) with the first area DA1 therebetween. That is, the first data line DL1 may be arranged on the second area DA2 toward the first area DA1 while not passing through the first area DA1.

According to some embodiments, the first data line DL1 may include a first line (e.g., a first sub-line) DL1a and a second line (e.g., a second sub-line) DL1b that are spaced apart from each other with the first area DA1 therebetween. The first line DL1a may be arranged below (for example, in a −y direction with respect to) the first area DA1, and the second line DL1b may be arranged above (for example, a +y direction with respect to) the first area DA1. The first line DL1a may be connected to the second pixel P2 located below the first area DA1, and the second line DL1b may be connected to the second pixel P2 located above the first area DA1, to provide data signals.

The second data line DL2 may be arranged on the first area DA1 and the second area DA2. That is, the second data line DL2 may be arranged on the second area DA2 toward the first area DA1, and the second data line DL2 may pass through the first area DA1. Thus, the second data line DL2 may supply a data signal not only to the second pixel P2 located in the second area DA2, but also to the first pixel P1 located in the first area DA1. FIGS. 3 and 4 illustrate that the second data line DL2 is arranged to have a linear shape on the first area DA1. However, the disclosure is not limited thereto. According to some embodiments, at least a portion of the second data line DL2 located on the first area DA1 may be bent as a zigzag shape to avoid (e.g., not overlap) the transmission portion TA.

The third data line DL3 may be arranged on the second area DA2. That is, the third data line DL3 may be located on the right side (for example, a +x direction) of the first area DA1, and may be located on the left side (for example, a −x direction) of the first area DA1, to not pass through the first area DA1. The third data line DL3 may supply a data signal to only the second pixel P2 that is located on the second area DA2.

According to some embodiments, the connection line CL may be arranged on the second area DA2 adjacent to the first area DA1 to bypass the first area DA1. The connection line CL may connect the first data line DL1 disconnected by the first area DA1, so that a data signal that is input to the first line DL1a may be transmitted to the second line DL1b. To this end, one end of the connection line CL may be connected to the first line DL1a, and another end of the connection line CL may be connected to the second line DL1b. According to some embodiments, the first data line DL1 and the connection line CL may be arranged on different layers from each other, and may be electrically connected to each other through a contact hole.

The connection line CL may overlap the second data line DL2 on the second area DA2. Also, the connection line CL may overlap a portion of the third data line DL3 arranged on the second area DA2. Accordingly, the connection line CL may affect the brightness of the second pixel P2 located on an area in which the connection line CL overlaps the second data line DL2 and/or the third data line DL3. Thus, according to some embodiments, as described below with reference to FIG. 7, etc., the connection line CL may be arranged to not overlap a node connection line N of the second pixel P2, thereby reducing or preventing the deterioration of the brightness of the second pixel P2 due to the connection line CL.

Referring to FIG. 5, a lower layer UL may be arranged on the substrate 100, and the first data line DL1 may be arranged on the lower layer UL. The lower layer UL may include a thin-film transistor TFT and insulating layers 201, 203, 205, and 207, as described below with reference to FIG. 8.

The first data line DL1 may include the first line DL1a and the second line DL1b apart from each other with the first area DA1 therebetween. The connection line CL may be located above the first data line DL1. An insulating layer (for example, a first planarization layer 208) may be arranged between the connection line CL and the first data line DL1. The connection line CL may be electrically connected to the first line DL1a and the second line DL1b respectively through a first contact hole CNT1 and a second contact hole CNT2 defined in the insulating layer (for example, in the first planarization layer 208).

A dummy line DM may further be arranged on the same layer as the connection line CL to be apart from the connection line CL. According to other embodiments, the dummy line DM may be omitted. The dummy line DM and the connection line CL may be concurrently formed in a manufacturing process. The dummy line DM will be described in detail with reference to FIG. 14.

Figure 6A:
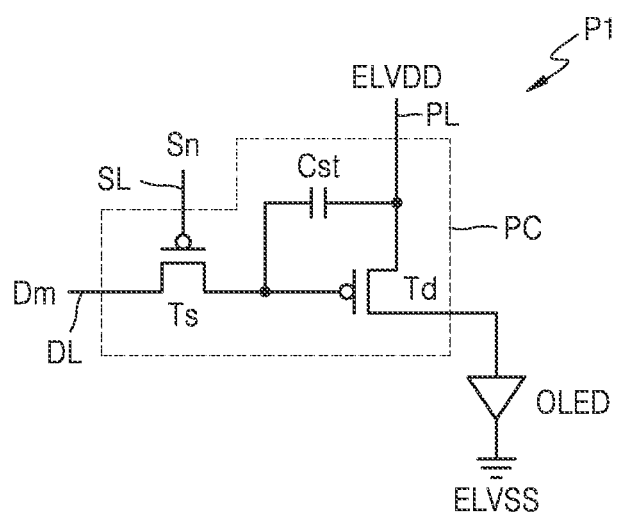
FIGS. 6A and 6B are equivalent circuit diagrams of a pixel according to some embodiments.
Figure 6B:
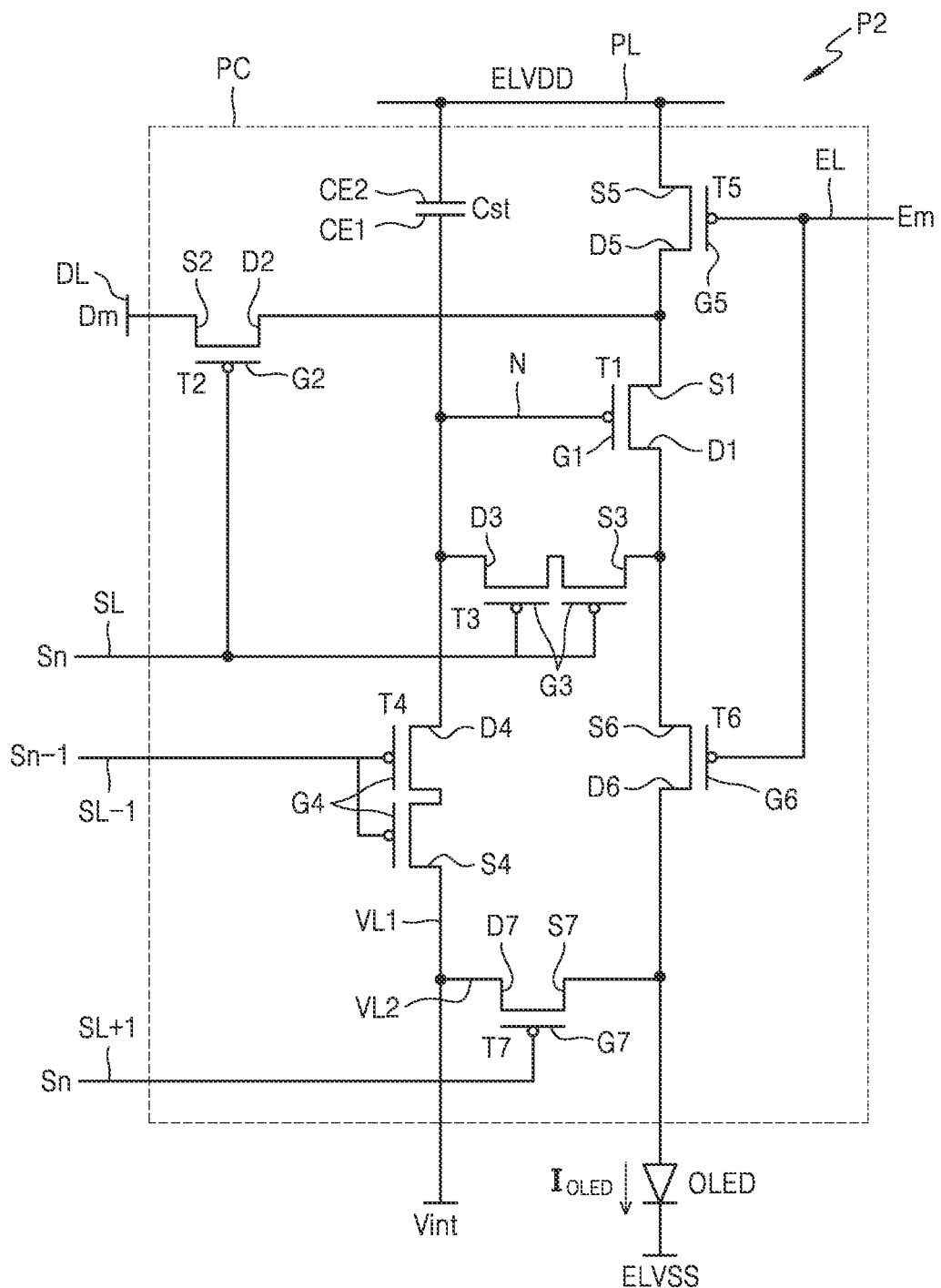
Figure 7:
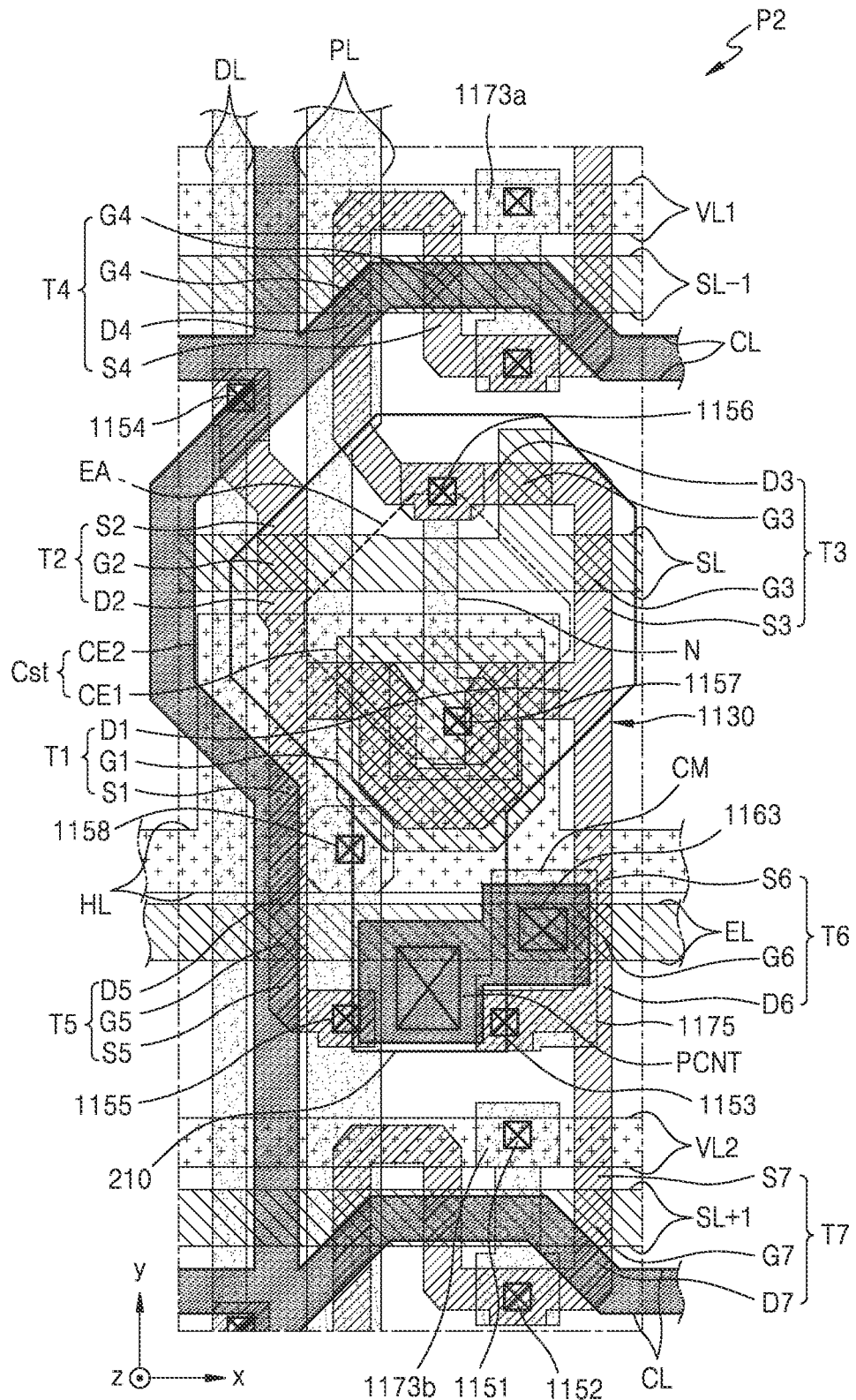
FIG. 7 is a schematic plan view of a structure of a pixel corresponding to the equivalent circuit diagram of FIG. 6B.
Figure 8:
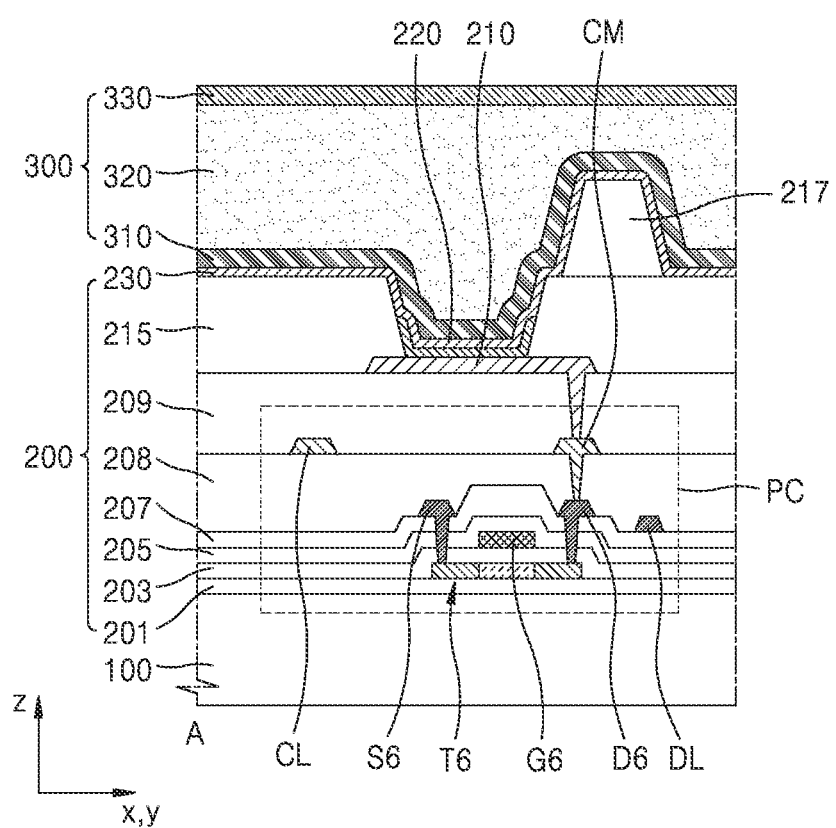
FIG. 8 is a schematic cross-sectional view of the structure of the pixel of FIG. 7.

FIGS. 6A and 6B are equivalent circuit diagrams of a pixel according to some embodiments, FIG. 7 is a schematic plan view of a structure of the pixel corresponding to the equivalent circuit diagram of FIG. 6B, and FIG. 8 is a schematic cross-sectional view of the structure of the pixel of FIG. 7.

A pixel circuit PC of FIG. 6A may include two thin-film transistors Ts and Td and a storage capacitor Cst. A pixel circuit PC of FIG. 6B may include seven thin-film transistors T1-T7 and a storage capacitor Cst. According to some embodiments, the first pixel P1 arranged in the first area DA1, and the second pixel P2 arranged in the second area DA2, may have different pixel circuits. For example, the first pixel P1 may include the pixel circuit PC of FIG. 6A, and the second pixel P2 may include the pixel circuit PC of FIG. 6B. However, the disclosure is not limited thereto. The first pixel P1 and the second pixel P2 may include the pixel circuit PC of FIG. 6A and/or the pixel circuit PC of FIG. 6B.

Referring to FIG. 6A, the first pixel P1 may include the pixel circuit PC connected to a scan line SL and a data line DL, and an organic light-emitting diode OLED connected to the pixel circuit PC.

The pixel circuit PC may include a driving thin-film transistor Td, a switching thin-film transistor Ts, and the storage capacitor Cst. The switching thin-film transistor Ts may be connected to the scan line SL and to the data line DL, and may be configured to transmit a data signal Dm, which is provided through the data line DL, to the driving thin-film transistor T1 in response to a scan signal Sn provided through the scan line SL.

The storage capacitor Cst may be connected to the switching thin-film transistor Ts and to the driving voltage line PL, and may be configured to store a voltage corresponding to a difference between a voltage received from the switching thin-film transistor Ts and a first power voltage ELVDD supplied to the driving voltage line PL.

The driving thin-film transistor Td may be connected to the driving voltage line PL and to the storage capacitor Cst, and may be configured to control a driving current, which flows from the driving voltage line PL through the organic light-emitting diode OLED, in correspondence with a voltage value stored in the storage capacitor Cst. The organic light-emitting diode OLED may emit light having a brightness based on the driving current.

It is described in FIG. 6A that the pixel circuit PC includes two thin-film transistors and one storage capacitor. However, the disclosure is not limited thereto. As illustrated in FIG. 6B, the pixel circuit PC may include seven thin-film transistors and one storage capacitor.

Referring to FIG. 6B, the pixel circuit PC may include a plurality of thin-film transistors T1 through T7 and the storage capacitor Cst. The thin-film transistors T1 through T7 and the storage capacitor Cst may be connected to signal lines SL, SL−1, SL+1, EL, and DL, a first initialization voltage line VL1, a second initialization voltage line VL2, and the driving voltage line PL.

The signal lines SL, SL−1, SL+1, EL, and DL may include a scan line SL configured to transmit a scan signal Sn, a previous scan line SL−1 configured to transmit a previous scan signal Sn−1 to a first initialization thin-film transistor T4, a next scan line SL+1 configured to transmit the scan signal Sn to a second initialization thin-film transistor T7, an emission control line EL configured to transmit an emission control signal En to an operation control thin-film transistor T5 and to an emission control thin-film transistor T6, and a data line DL configured to cross the scan line SL and to transmit a data signal Dm. The driving voltage line PL may be configured to transmit a driving voltage ELVDD to the driving thin-film transistor T1, the first initialization voltage line VL1 may be configured to transmit an initialization voltage Vint to the first initialization thin-film transistor T4, and the second initialization voltage line VL2 may be configured to transmit the initialization voltage Vint to the second initialization thin-film transistor T7.

A driving gate electrode G1 of the driving thin-film transistor T1 may be connected to a lower electrode CE1 of the storage capacitor Cst, a driving source electrode S1 of the driving thin-film transistor T1 may be connected to the driving voltage line PL through the operation control thin-film transistor T5, and a driving drain electrode D1 of the driving thin-film transistor T1 may be electrically connected to a pixel electrode of the organic light-emitting diode OLED through the emission control thin-film transistor T6. The driving thin-film transistor T1 may be configured to receive a data signal Dm according to a switching operation of the switching thin-film transistor T2, and may supply a driving current IDLED to the organic light-emitting diode OLED.

A switching gate electrode G2 of the switching thin-film transistor T2 may be connected to the scan line SL, a switching source electrode S2 of the switching thin-film transistor T2 may be connected to the data line DL, and a switching drain electrode D2 of the switching thin-film transistor T2 may be connected to the diving source electrode S1 of the driving thin-film transistor T1 and to the driving voltage line PL through the operation control thin-film transistor T5. The switching thin-film transistor T2 may be turned on in response to a scan signal Sn transmitted through the scan line SL, and may be configured to perform a switching operation for transmitting the data signal Dm transmitted through the data line DL to the driving source electrode S1 of the driving thin-film transistor T1.

A compensation gate electrode G3 of the compensation thin-film transistor T3 may be connected to the scan line SL, a compensation source electrode S3 of the compensation thin-film transistor T3 may be connected to the driving drain electrode D1 of the driving thin-film transistor T1 while being connected to the pixel electrode of the organic light-emitting diode OLED through the emission control thin-film transistor T6, and a compensation drain electrode D3 of the compensation thin-film transistor T3 may be connected to the lower electrode CE1 of the storage capacitor Cst, to a first initialization drain electrode D4 of the first initialization thin-film transistor T4, and to the driving gate electrode G1 of the driving thin-film transistor T1. The compensation thin-film transistor T3 may be turned on in response to a scan signal Sn received through the scan line SL, and may be configured to electrically connect the driving gate electrode G1 and the driving drain electrode D1 of the driving thin-film transistor T1 to diode-connect the driving thin-film transistor T1.

A first initialization gate electrode G4 of the first initialization thin-film transistor T4 may be connected to the previous scan line SL−1, a first initialization source electrode S4 of the first initialization thin-film transistor T4 may be connected to the first initialization voltage line VL1, and the first initialization drain electrode D4 of the first initialization thin-film transistor T4 may be connected to the lower electrode CE1 of the storage capacitor Cst, to the compensation drain electrode D3 of the compensation thin-film transistor T3, and to the driving gate electrode G1 of the driving thin-film transistor T1. The first initialization thin-film transistor T4 may be turned on in response to a previous scan signal Sn−1 received through the previous scan line SL−1, and may be configured to perform an initialization operation of transmitting the initialization voltage Vint to the driving gate electrode G1 of the driving thin-film transistor T1 to initialize the voltage of the driving gate electrode G1 of the driving thin-film transistor T1.

An operation control gate electrode G5 of the operation control thin-film transistor T5 may be connected to the emission control line EL, an operation control source electrode S5 of the operation control thin-film transistor T5 may be connected to the driving voltage line PL, and an operation control drain electrode D5 of the operation control thin-film transistor T5 may be connected to the driving source electrode S1 of the driving thin-film transistor T1 and to the switching drain electrode D2 of the switching thin-film transistor T2.

An emission control gate electrode G6 of the emission control thin-film transistor T6 may be connected to the emission control line EL, an emission control source electrode S6 of the emission control thin-film transistor T6 may be connected to the driving drain electrode D1 of the driving thin-film transistor T1 and to the compensation source electrode S3 of the compensation thin-film transistor T3, and an emission control drain electrode D6 of the emission control thin-film transistor T6 may be electrically connected to a second initialization source electrode S7 of the second initialization thin-film transistor T7 and to the pixel electrode of the organic light-emitting diode OLED.

The operation control thin-film transistor T5 and the emission control thin-film transistor T6 may be concurrently or substantially simultaneously turned on in response to an emission control signal En received through the emission control line EL so that a driving voltage ELVDD may be transmitted to the organic light-emitting diode OLED, and so that a driving current IDLED may flow in the organic light-emitting diode OLED.

A second initialization gate electrode G7 of the second initialization thin-film transistor T7 may be connected to the next scan line SL+1, the second initialization source electrode S7 of the second initialization thin-film transistor T7 may be connected to the emission control drain electrode D6 of the emission control thin-film transistor T6 and to the pixel electrode of the main organic light-emitting diode OLED, and a second initialization drain electrode D7 of the second initialization thin-film transistor T7 may be connected to the second initialization voltage line VL2.

In some embodiments, the scan line SL and the next scan line SL+1 are electrically connected with each other, and thus, the same scan signal Sn may be applied to the scan line SL and the next scan line SL+1. Thus, the second initialization thin-film transistor T7 may be turned on in response to the scan signal Sn transmitted through the next scan line SL+1, and may be configured to perform the operation of initializing the pixel electrode of the organic light-emitting diode OLED. An upper electrode CE2 of the storage capacitor Cst may be connected to the driving voltage line PL, and a common electrode of the organic light-emitting diode OLED may be connected to a common voltage ELVSS. Accordingly, the organic light-emitting diode OLED may receive the driving current IDLED from the driving thin-film transistor T1 to emit light to display an image.

FIG. 6B illustrates that the compensation thin-film transistor T3 and the first initialization thin-film transistor T4 have dual gate electrodes. However, the compensation thin-film transistor T3 and/or the first initialization thin-film transistor T4 may have one gate electrode in other embodiments.

Hereinafter, the structure of one pixel (for example, the second pixel P2) will be described in more detail with reference to FIGS. 7 and 8. Also, FIG. 8 illustrates only the emission control thin-film transistor T6 included in the pixel circuit PC, for convenience of description.

The driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7 may be arranged along a semiconductor layer 1130 (see FIG. 7), and one or more portions of the semiconductor layer 1130 may be included in semiconductor layers of the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7.

The semiconductor layer 1130 may be formed on the substrate 100. As another example, a buffer layer 201 may be formed on the substrate 100, and the semiconductor layer 1130 may be formed on the buffer layer 201.

The buffer layer 201 may reduce or block penetration of impurities, moisture, or external materials from below the substrate 100, and may provide a planarized surface to the substrate 100. The buffer layer 201 may include an inorganic material, such as oxide or nitride, an organic material, or an organic and inorganic compound, and may have a single-layered structure or a multi-layered structure including an inorganic material and an organic material.

The semiconductor layer 1130 may include low temperature polysilicon (LTPS). A polysilicon material may have a high electron mobility (e.g., about 100 $_{cm2}$/Vs or higher), and thus, may have low power consumption and high reliability. As another example, the semiconductor layer 1130 may also include amorphous silicon (a-Si) and/or an oxide semiconductor. One or more semiconductor layers of the plurality of thin-film transistors may include LTPS and the other semiconductor layers may include a-Si and/or an oxide semiconductor.

A first gate insulating layer 203 may be located on the semiconductor layer 1130, and the scan line SL, the previous scan line SL−1, the next scan line SL+1, and the emission control line EL may be located on the first gate insulating layer 203.

The first gate insulating layer 203 may include $SiO_2$, $SiN_x$, SiON, $Al_2O_3$, $TiO_2$, $Ta_2O_5$, $HfO_2$, or $ZnO_2$.

Portions of the scan line SL that overlap channel areas of the switching thin-film transistors T2 and the compensation thin-film transistor T3 may correspond to the switching gate electrode G2 and to the compensation gate electrode G3, respectively. A portion of the previous scan line SL−1 that overlaps a channel area of the first initialization thin-film transistor T4 may correspond to the first initialization gate electrode G4. A portion of the next scan line SL+1 that overlaps a channel area of the second initialization thin-film transistor T7 may correspond to the second initialization gate electrode G7. Portions of the emission control line EL that overlap channel areas of the operation control thin-film transistor T5 and the emission control thin-film transistor T6 may correspond to the operation control gate electrode G5 and to the emission control gate electrode G6, respectively.

A second gate insulating layer 205 may be arranged on the scan line SL, the previous scan line SL−1, the next scanline SL+1, and the emission control line EL. The second gate insulating layer 205 may include $SiO_2$, $SiN_x$, SiON, $Al_2O_3$, $TiO_2$, $Ta_2O_5$, $HfO_2$, or $ZnO_2$.

An electrode voltage line HL, the first initialization voltage line VL1, and the second initialization voltage line VL2 may be arranged on the second gate insulating layer 205. The electrode voltage line HL may cover at least a portion of the driving gate electrode G1 and may form the storage capacitor Cst together with the driving gate electrode G1.

The lower electrode CE1 of the storage capacitor Cst may be formed as an integral body with the gate electrode G1 of the driving thin-film transistor T1. For example, the gate electrode G1 of the driving thin-film transistor T1 may function as the lower electrode CE1 of the storage capacitor Cst. A portion of the electrode voltage line HL, the portion overlapping the driving gate electrode G1, may correspond to the upper electrode CE2 of the storage capacitor Cst. Thus, the second gate insulating layer 205 may function as a dielectric layer of the storage capacitor Cst.

An interlayer insulating layer 207 may be located on the electrode voltage line HL, the first initialization voltage line VL1, and the second initialization voltage line VL2. The interlayer insulating layer 207 may include $SiO_2$, $SiN_x$, SiON, $Al_2O_3$, $TiO_2$, $Ta_2O_5$, $HfO_2$, or $ZnO_2$.

The data line DL, the driving voltage line PL, first and second initialization connection lines 1173a and 1173b, the node connection line N, and a connecting metal 1175 may be arranged on the interlayer insulating layer 207. The data line DL, the driving voltage line PL, the node connection line N, and the connecting metal 1175 may include a conductive material including Mo, Al, Cu, Ti, etc. and may include multiple layers or a single layer including the materials described above. For example, the data line DL, the driving voltage line PL, the node connection line N, and the connecting metal 1175 may include a multi-layered structure of Ti/Al/Ti.

The data line DL may be connected to the switching source electrode S2 of the switching thin-film transistor T2 through a contact hole 1154. A portion of the data line DL may be understood as the switching source electrode S2.

The driving voltage line PL may be connected to the upper electrode CE2 of the storage capacitor Cst through a contact hole 1158 formed in the interlayer insulating layer 207. Thus, the electrode voltage line HL may have the same voltage level (e.g., a constant voltage) as the driving voltage line PL. Also, the driving voltage line PL may be connected to the operation control drain electrode D5 through a contact hole 1155.

The first initialization voltage line VL1 may be connected to the first initialization thin-film transistor T4 through the first initialization connection line 1173a, and the second initialization voltage line VL2 may be connected to the second initialization thin-film transistor T7 through the second initialization connection line 1173b. The first initialization voltage line VL1 and the second initialization voltage line VL2 may have the same constant voltage (for example, about −2 V, etc.).

An end of the node connection line N may be connected to the compensation drain electrode D3 through a contact hole 1156, and the other end of the node connection line N may be connected to the driving gate electrode G1 through a contact hole 1157.

The connecting metal 1175 may be connected to the semiconductor layer of the emission control thin-film transistor T6 through a contact hole 1153 penetrating the interlayer insulating layer 207, the second gate insulating layer 205, and the first gate insulating layer 203. The emission control thin-film transistor T6 may be electrically connected to a pixel electrode 210 of the organic light-emitting diode OLED through the connecting metal 1175.

The first planarization layer 208 may be located on the data line DL, the driving voltage line PL, the first and second initialization connection lines 1173a and 1173b, the node connection line N, and the connecting metal 1175.

In FIGS. 4 and 5, the structure of one pixel circuit PC is described. However, a plurality of pixels P having the same pixel circuit PC may be arranged in a first direction (for example, a y direction) and a second direction (for example, an x direction). In this case, the first initialization voltage line VL1, the previous scan line SL−1, the second initialization voltage line VL2, and the next scan line SL+1 may be shared by two pixel circuits PC adjacent to each other in the first direction (for example, the y direction).

That is, the first initialization voltage line VL1 and the previous scan line SL−1 may be electrically connected to a second initialization thin-film transistor of another pixel circuit PC, which is arranged above the pixel circuit PC illustrated in FIG. 7 in the first direction (for example, the y direction) based on the drawing. Thus, the previous scan signal applied to the previous scan line SL−1 may be transmitted to the second initialization thin-film transistor of the other pixel circuit PC as a next scan signal. Likewise, the second initialization voltage line VL2 and the next scan line SL+1 may be electrically connected to a first initialization thin-film transistor of yet another pixel circuit PC, which is arranged to be adjacent to a lower portion of the pixel circuit PC illustrated in FIG. 5 in the first direction (for example, the y direction) based on the drawing. Thus, the second initialization voltage line VL2 and the next scan line SL+1 may be configured to transmit the previous scan signal and the initialization voltage.

Referring to FIG. 8 again, a connecting metal CM and the connection line CL may be arranged on the first planarization layer 208, and a second planarization layer 209 may be located on the connecting metal CM and the connection line CL.

The connecting metal CM may be between a thin-film transistor (for example, the emission control thin-film transistor T6) and the pixel electrode 210, so that the pixel electrode 210 may be electrically connected to the emission control drain electrode D6.

The connection line CL may be arranged on the first planarization layer 208 and may include the same material as the connecting metal CM. The connection line CL may electrically connect the first data line DL1, which is disconnected via the first area DA1 as described above with reference to FIG. 3, etc. The connection line CL will be described in detail below.

The second planarization layer 209 may have a planarized upper surface to planarize the pixel electrode 210. The first planarization layer 208 may include a single layer or multiple layers including an organic material. The first planarization layer 208 may include benzocyclobutene (BCB), polyimide, hexamethyldisiloxane (HMDSO), polymethylmethacrylate (PMMA), or a general-purpose polymer, such as polystyrene (PS), a polymer derivate having a phenol-based group, an acryl-based polymer, an imide-based polymer, an arylether-based polymer, an amide-based polymer, a fluorine-based polymer, a p-xylene-based polymer, a vinyl alcohol-based polymer, and a blend thereof. The first planarization layer 208 may include an inorganic material. The first planarization layer 208 may include $SiO_2$, $SiN_x$, SiON, $Al_2O_3$, $TiO_2$, $Ta_2O_5$, $HfO_2$, or $ZnO_2$. When the first planarization layer 208 includes an inorganic material, chemical planarization polishing may be performed according to cases. The first planarization layer 208 may include both an organic material and an inorganic material.

The organic light-emitting diode OLED may include the pixel electrode 210, an opposite electrode 230, and an intermediate layer 220 located therebetween and including an emission layer.

The pixel electrode 210 may be connected to the connecting metal CM through a contact hole PCNT, the connecting metal CM may be connected to the lower connecting metal 1175 through a contact hole 1163, and the lower connecting metal 1175 may be connected to the emission control drain electrode D6 through the contact hole 1153.

The pixel electrode 210 may include a (semi) transmissive electrode or a reflection electrode. In some embodiments, the pixel electrode 210 may include a reflective layer including Ag, Mg, Al, Pt, Pd, Au, Ni, Nd, Ir, Cr, and a compound thereof, and a transparent or semi-transparent electrode layer on the reflective layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), or aluminum zinc oxide (AZO). According to some embodiments, the pixel electrode 210 may include a structure in which ITO/Ag/ITO layers are stacked.

The pixel-defining layer 215 may be arranged on the first planarization layer 208, and a spacer 217 may be arranged on the pixel-defining layer 215. The pixel-defining layer 215 may have an opening to expose a central portion of the pixel electrode 210 so as to define an emission area of a pixel. Also, the pixel-defining layer 215 may increase a distance between edges of the pixel electrode 210 and the opposite electrode 230 thereon to reduce or prevent the likelihood of arcs, etc. from occurring at the edges of the pixel electrode 210. The pixel-defining layer 215 may be formed by using a spin coating method, etc., by using an organic insulating material, such as polyimide, polyamide, acryl resins, BCB, HMDSO, phenol resins, etc.

The intermediate layer 220 may include an organic emission layer. The organic emission layer may include an organic material including a fluorescent or phosphorescent material for emitting red, green, blue, or white light. The organic emission layer may include a low molecular-weight organic material or a high molecular-weight organic material. Also, a functional layer, such as a hole transport layer (HTL), a hole injection layer (HIL), an electron transport layer (ETL), and an electron injection layer (EIL), may be selectively further arranged above and below the organic emission layer. The intermediate layer 220 may be arranged to correspond to each of the plurality of pixel electrodes 210. However, the disclosure is not limited thereto. At least one or more layers included in the intermediate layer 220 may be integrally formed throughout the plurality of pixel electrodes 210.

The opposite electrode 230 may include a transmissive electrode or a reflection electrode. According to some embodiments, the opposite electrode 230 may include a transparent or semi-transparent electrode and may include a metal thin-film having a low work function, such as Li, Ca, LiF/Ca, LiF/Al, Al, Ag, Mg, and a compound thereof. Also, a transparent conductive oxide (TCO) layer, such as ITO, IZO, ZnO, or $In_2O_3$, may further be arranged above the metal thin-film.

The opposite electrode 230 may be integrally formed as a single body to correspond to the plurality of pixel electrodes 210. According to some embodiments, the opposite electrode 230 may be formed to correspond to the entire surface of the first area DA1 and to the entire surface of the second area DA2. According to other embodiments, the opposite electrode 230 might not be arranged on the transmission portion TA. In this case, the opposite electrode 230 may have a shape in which the opposite electrode 230 is patterned for each pixel area PA in the first area DA1. To this end, a portion of the opposite electrode 230 that corresponds to the transmission portion TA may be removed through a laser lift off operation, or the opposite electrode 230 may be omitted from the transmission portion TA through FMM mask patterning.

Also, a thin-film encapsulation layer 300 including a first inorganic encapsulation layer 310, a second inorganic encapsulation layer 330, and an organic encapsulation layer 320 therebetween may be formed on the opposite electrode 230.

The first inorganic encapsulation layer 310 and the second inorganic encapsulation layer 330 may include at least one inorganic insulating material from among aluminum oxide, titanium oxide, tantalum oxide, hafnium oxide, zinc oxide, silicon oxide, silicon nitride, and silicon oxynitride. The organic encapsulation layer 320 may include polyethylene terephthalate, polyethylene naphthalate, polycarbonate, polyimide, polyethylene sulfonate, polyoxymethylene, polyarylate, hexamethyldisiloxane, acryl-based resins (for example, polymethylmethacrylate, a polyacrylic acid, etc.), or an arbitrary combination thereof.

Referring to FIG. 7 again, the connection line CL may be arranged on the first planarization layer 208, and may generally extend in the first direction (for example, the y direction) and the second direction (for example, the x direction). That is, unlike other lines (for example, the data line DL or the scan line SL) extending in the first direction (for example, the y direction) or the second direction (for example, the x direction), the connection line CL may extend in both the first direction (for example, the y direction) and the second direction (for example, the x direction) and may have, for example, a mesh form. However, in this case, that the connection line CL may "generally extend" denotes that the connection line CL may tend to extend. In other words, while the connection line CL may extend in the first direction (for example, the y direction) or the second direction (for example, the x direction), a portion of the connection line CL may have a bent shape to avoid (e.g., to be spaced from or to not overlap) a relevant line or a relevant conductive layer.

The connection line CL may be bent on a plane at least twice to avoid at least one pixel electrode 210. According to some embodiments, for example, the at least one pixel electrode 210 may correspond to a second pixel electrode 210R (FIG. 9) for emitting red light and/or a third pixel electrode 210B (FIG. 9) for emitting blue light. In the case of a first pixel electrode 210G (FIG. 9) for emitting green light, the connection line CL may overlap at least a portion of the first pixel electrode 210G.

Like this, because the connection line CL is arranged to avoid the at least one pixel electrode 210, at least a portion of the connection line CL may have, for example, a zigzag shape. According to a comparative embodiment, when a connection line passes under a pixel electrode, non-uniform reflection may be caused due to a non-planarized emission area of a pixel. Thus, the display quality of a display apparatus may deteriorate. According to a display apparatus according to some embodiments, the connection line CL may be arranged to avoid at least one pixel electrode 210, and thus, an emission area of a pixel may be planarized to increase the emission uniformity, and thus, the display quality of the display apparatus may be improved.

Figure 9:
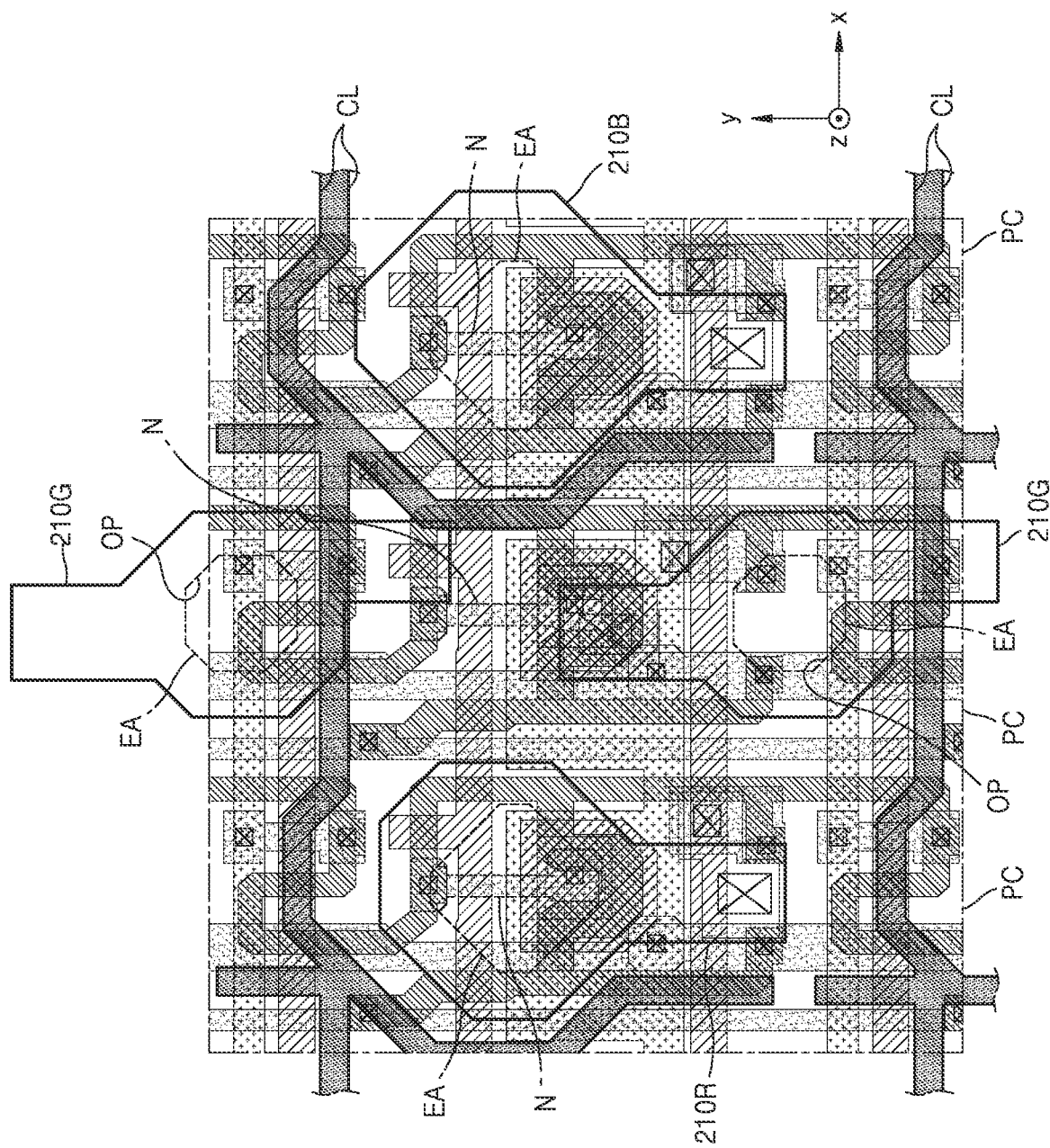
FIG. 9 is a schematic plan view of a portion of a display apparatus according to some embodiments.
Figure 10:
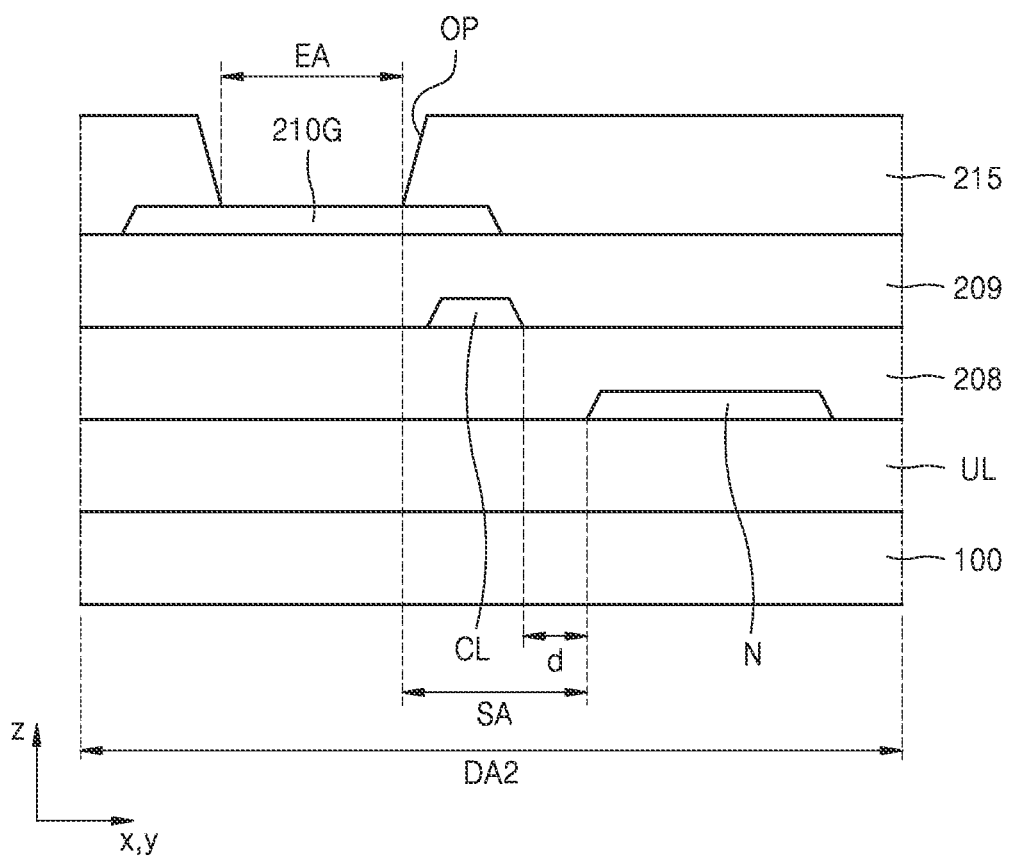
FIG. 10 is a schematic cross-sectional view of the portion of the display apparatus of FIG. 9.
Figure 11:
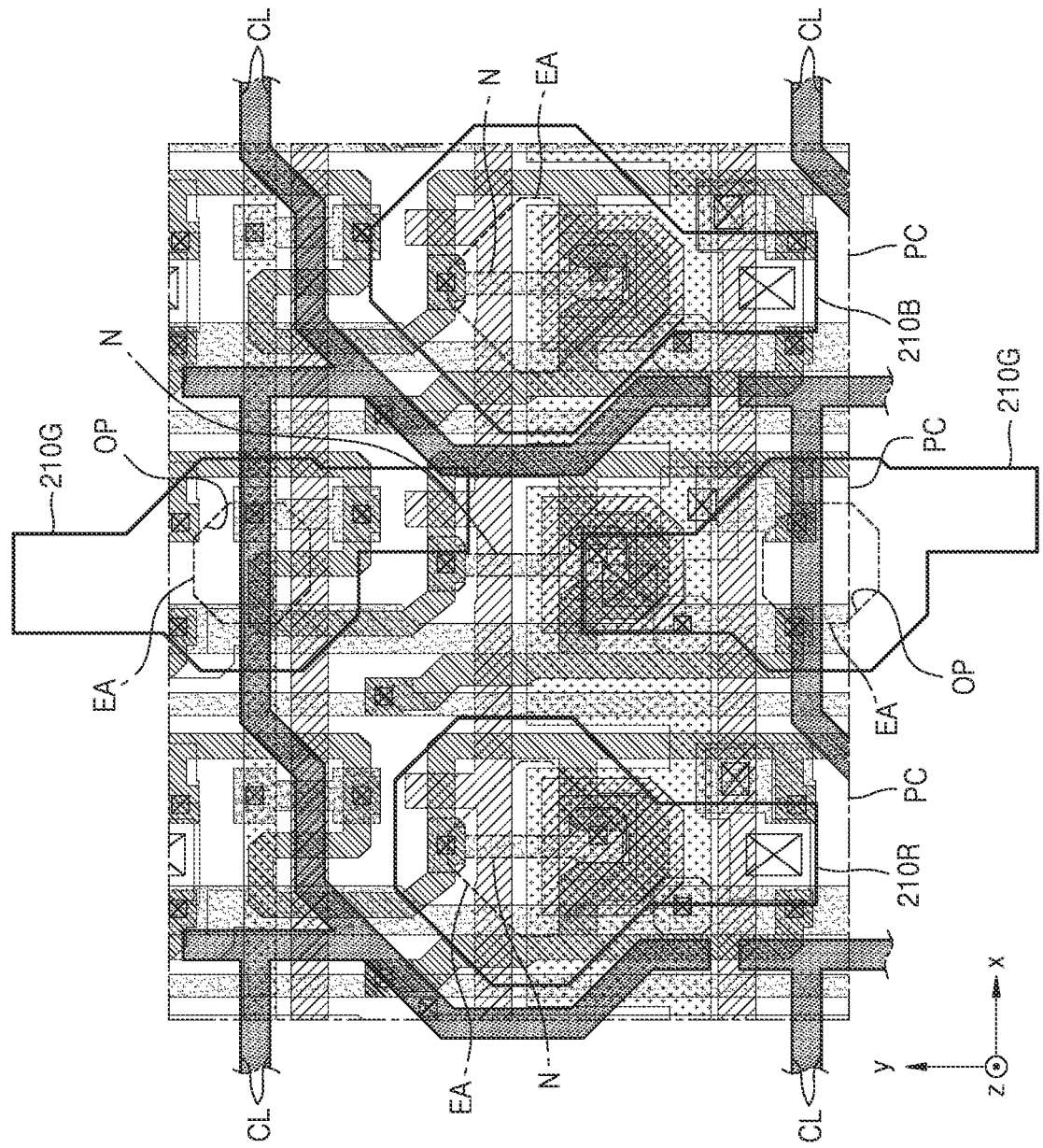
FIG. 11 is a schematic plan view of a portion of a display apparatus according to some embodiments.
Figure 12:
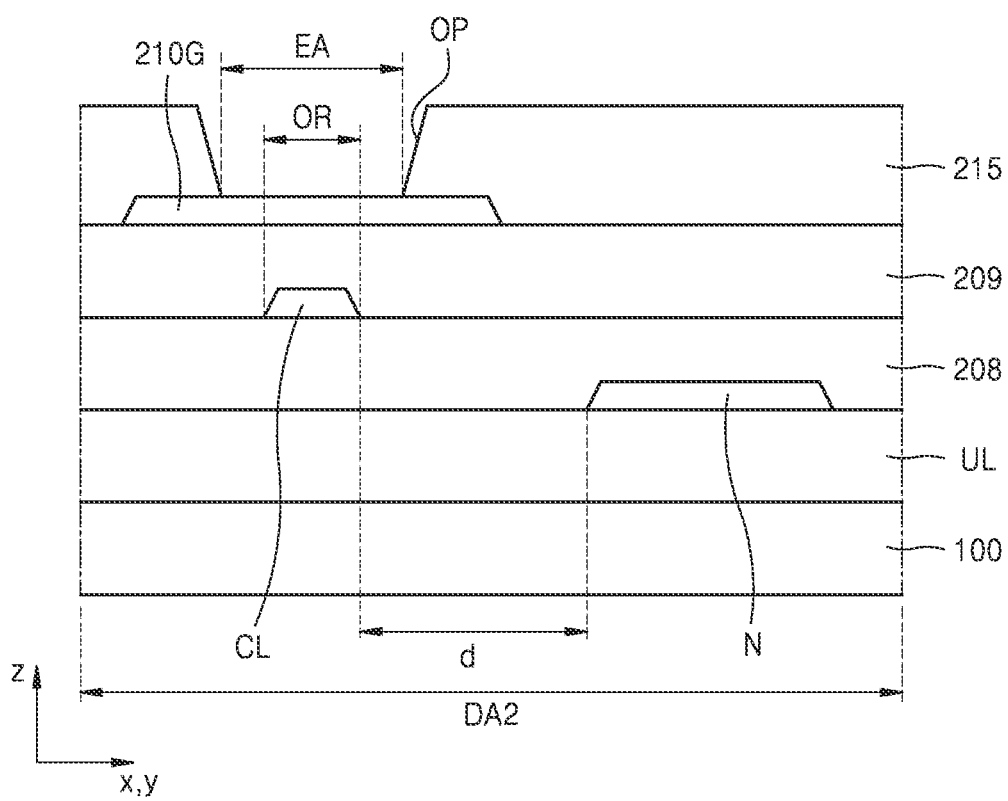
FIG. 12 is a schematic cross-sectional view of the portion of the display apparatus of FIG. 11.

FIG. 9 is a schematic plan view of a portion of a display apparatus according to some embodiments, FIG. 10 is a schematic cross-sectional view of the portion of the display apparatus of FIG. 9, FIG. 11 is a schematic plan view of a portion of a display apparatus according to some embodiments, and FIG. 12 is a schematic cross-sectional view of the portion of the display apparatus of FIG. 11.

FIGS. 9 through 12 illustrate a plurality of second pixels P2 arranged in the second area DA2.

Referring to FIGS. 9 and 10, pixel circuits PC may be continually formed on the second area DA2, and the first pixel electrode 210G, the second pixel electrode 210R, and the third pixel electrode 210B may be electrically connected to each pixel circuit PC. According to some embodiments, the first pixel electrode 210G may correspond to a pixel electrode for emitting green light, the second pixel electrode 210R may correspond to a pixel electrode for emitting red light, and the third pixel electrode 210B may correspond to a pixel electrode for emitting blue light. However, the disclosure is not necessarily limited thereto.

As described above, the connection line CL may be arranged to avoid the second and third pixel electrodes 210R and 210B. In this process, while the connection line CL may extend in the first direction (for example, the y direction) and the second direction (for example, the x direction), the connection line CL may be bent at least twice.

The connection line CL might not overlap the node connection line N of the pixel circuit PC. According to a comparative example, when a connection line overlaps a node connection line of a pixel circuit, a parasitic capacitance may occur between the connection line and the node connection line, and thus, a brightness of a corresponding pixel may be changed. In the display apparatus according to some embodiments, the connection line CL may be arranged to not overlap the node connection line N of the pixel circuit PC, and thus, a parasitic capacitance between the connection line CL and the node connection line N may be removed, reduced, or minimized, and thus, the display quality of the display apparatus may be improved.

Although the connection line CL may be arranged to not overlap the node connection line N of the pixel circuit PC, the connection line CL may at least partially overlap the first pixel electrode 210G. However, also in this case, the connection line CL might not overlap an emission area EA of the first pixel electrode 210G. Because the connection line CL may be arranged to avoid the emission area EA of the first pixel electrode 210G, the uniformity of the emission area EA may be improved.

FIG. 10 illustrates an arrangement relationship between the connection line CL, the node connection line N, and the first pixel electrode 210G. Other lines and/or electrodes may be arranged on the same layer as the connection line CL, the node connection line N, and the first pixel electrode 210G. However, for convenience of description, FIG. 10 illustrates only the connection line CL, the node connection line N, and the first pixel electrode 210G.

Referring to FIG. 10, the lower layer UL may be arranged on the substrate 100, and the node connection line N may be located on the lower layer UL. The connection line CL may be located above the node connection line N with the first planarization layer 208 therebetween. The first pixel electrode 210G may be located above the connection line CL with the second planarization layer 209 therebetween. In FIG. 10, the lower layer UL may include at least one of the buffer layer 201, the first gate insulating layer 203, the second gate insulating layer 205, and the interlayer insulating layer 207 of FIG. 8.

The emission area EA of the first pixel electrode 210G may be defined by the opening OP of the pixel-defining layer 215. The connection line CL may be arranged to not overlap the node connection line N and to be apart from the node connection line N in a plan view by a distance d. Also, the connection line CL might not overlap the emission area EA of the first pixel electrode 210G. Accordingly, the connection line CL may extend through an area SA between the node connection line N of the pixel circuit PC and the emission area EA of the first pixel electrode 210G in a plan view.

Referring to FIGS. 11 and 12, and in a manner that is similar to the above description, the connection line CL may be apart from the node connection line N of the pixel circuit PC in a plan view by a distance so as to not overlap the node connection line N, while at least partially overlapping the first pixel electrode 210G. Unlike some embodiments described above, the connection line CL may be arranged to overlap the emission area EA of the first pixel electrode 210G. In this case, the connection line CL may pass through a central portion of the emission area EA of the first pixel electrode 210G. In other words, the emission area EA of the first pixel electrode 210G may be approximately symmetrically divided into two portions based on the connection line CL (for example, an overlapping area OR).

According to a comparative example, when a connection line overlaps an emission area of a first pixel electrode in a biased direction, rather than overlapping a central portion of the emission area, the emission area of the first pixel electrode may be asymmetrically divided into two portions based on the connection line. This may cause non-uniform reflection due to the non-planarized emission area, which may further cause deterioration of emission uniformity. Thus, according to the display apparatus according to some embodiments, while the connection line CL may be arranged to avoid the node connection line N, the connection line CL may be arranged to pass through the central portion of the emission area EA of the first pixel electrode 210G. Thus, the display quality of the display apparatus may be improved.

Figure 13:
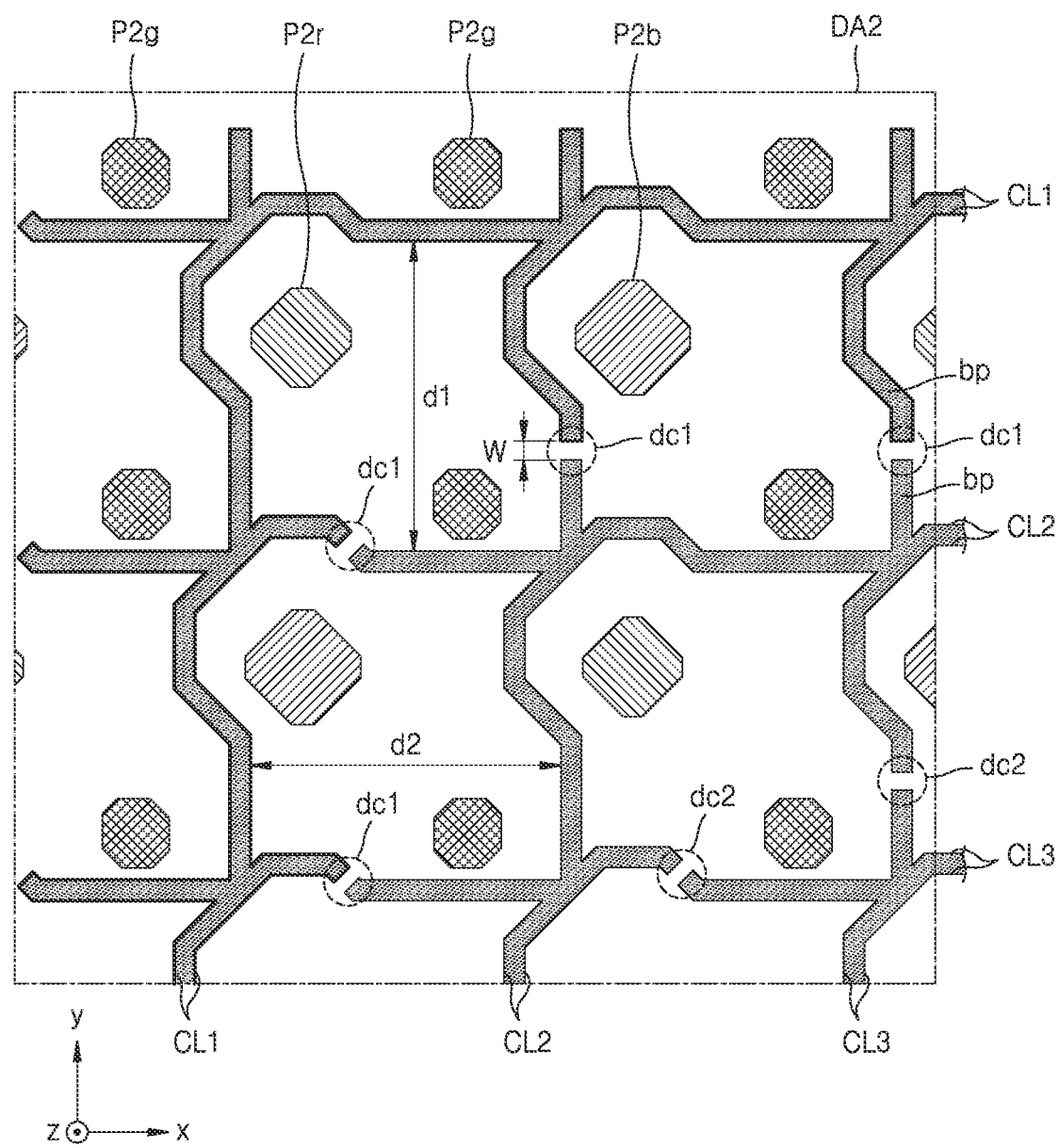
FIGS. 13 and 14 are schematic plan views of portions of a second area of a display apparatus according to some embodiments, the portions corresponding to region C and region D of FIG. 3, respectively.
Figure 14:
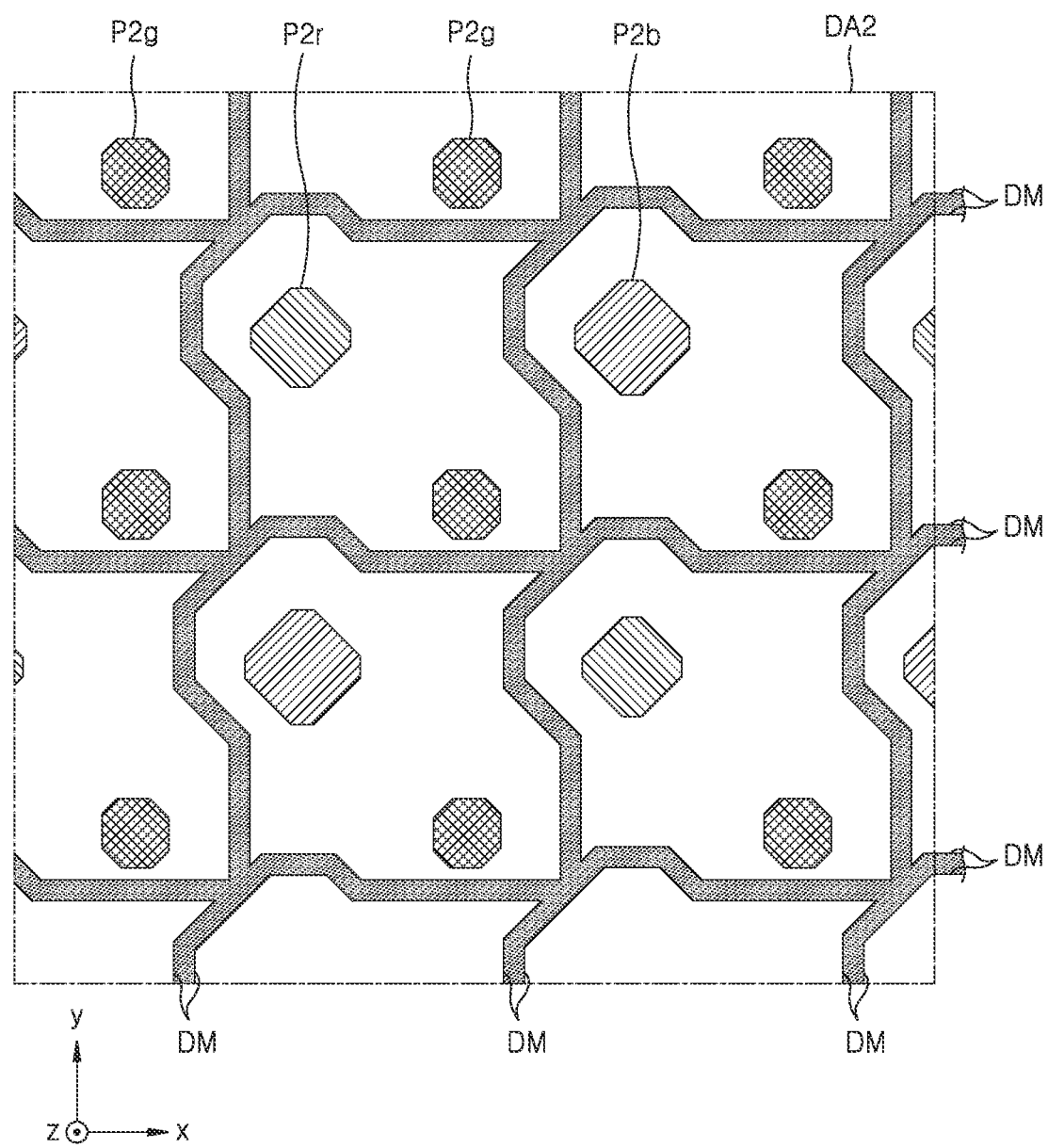

FIGS. 13 and 14 are schematic plan views of a portion of the second area DA2 of the display apparatus 1 according to some embodiments. FIG. 13 corresponds to region C of FIG. 3, and FIG. 14 corresponds to region D of FIG. 3.

FIG. 13 illustrates a portion of the second area DA2, in which first through third connection lines CL1, CL2, and CL3 are arranged, and FIG. 14 illustrates a portion of the second area DA2, in which a dummy line DM is arranged. Referring to FIGS. 13 and 14, the first through third connection lines CL1, CL2, and CL3, and the dummy line DM may have substantially the same shape. That is, the first through third connection lines CL1, CL2, and CL3, and the dummy line DM may be formed by the same process in a manufacturing process.

In the manufacturing process, a conductive pattern for forming the first through third connection lines CL1, CL2, and CL3, and the dummy line DM may be formed to correspond to the entire surface of the second area DA2. The conductive pattern may be formed to have a mesh form on the entire surface of the second area DA2. A portion of the conductive pattern may be disconnected so as to form the first through third connection lines CL1, CL2, and CL3, and the dummy line DM, which are electrically separated. FIG. 13 illustrates the three connection lines CL1, CL2, and CL3 for convenience of description. However, a greater number of connection lines may be arranged in the various embodiments.

FIG. 13 illustrates a plurality of second pixels P2r, P2g, and P2b, and the first through third connection lines CL1 through CL3. As described above, portions of the first through third connection lines CL1 through CL3 may bent to avoid the plurality of second pixels P2r, P2g, and P2b.

The first through third connection lines CL1 through CL3 may generally extend in a first direction (for example, an x direction) and a second direction (for example, a y direction). The first through third connection lines CL1 through CL3 may be formed to generally have a mesh form. However, respective first and second disconnection portions dc1 and dc2 may be formed between the first through third connection lines CL1 through CL3, and thus, the first through third connection lines CL1 through CL3 may apply different respective data signals. According to some embodiments, the plurality of first disconnection portions dc1 may be formed between the first and second connection lines CL1 and CL2, and the plurality of second disconnection portions dc2 may be formed between the second and third connection lines CL2 and CL3.

FIG. 13 illustrates that a width w of the first and second disconnection portions dc1 and dc2 are substantially the same as a width of the first through third connection lines CL1 through CL3. However, the disclosure is not necessarily limited thereto. The width w of the first and second disconnection portions dc1 and dc2 may be the same as, or less than, distances d1 and d2 between the first through third connection lines CL1 through CL3 extending in the same direction. According to some embodiments, when the width w of the first and second disconnection portions dc1 and dc2 are the same as the distances d1 and d2 between the first through third connection lines CL1 through CL3, a branch portion bp where the first and second disconnection portions dc1 and dc2 are formed may be removed.

FIG. 14 illustrates the plurality of second pixels P2r, P2g, and P2b, and the dummy line DM. Similarly to the first through third connection lines CL1 through CL3 described above, portions of the dummy line DM may be bent to avoid the plurality of second pixels P2r, P2g, and P2b.

The dummy line DM may denote a portion of the conductive pattern described above, the portion being disconnected and separated from the first through third connection lines CL1 through CL3. The first through third connection lines CL1 through CL3 may be arranged on portions of the second area DA2, the portions being adjacent to the first area DA1, and the dummy line DM may be arranged on most of the other portions of the second area DA2. According to some embodiments, because the dummy line DM is formed as the mesh form, a first power voltage ELVDD may be applied to the dummy line DM to use the dummy line DM as a driving voltage line. According to other embodiments, the dummy line DM may be removed.

Figure 15:
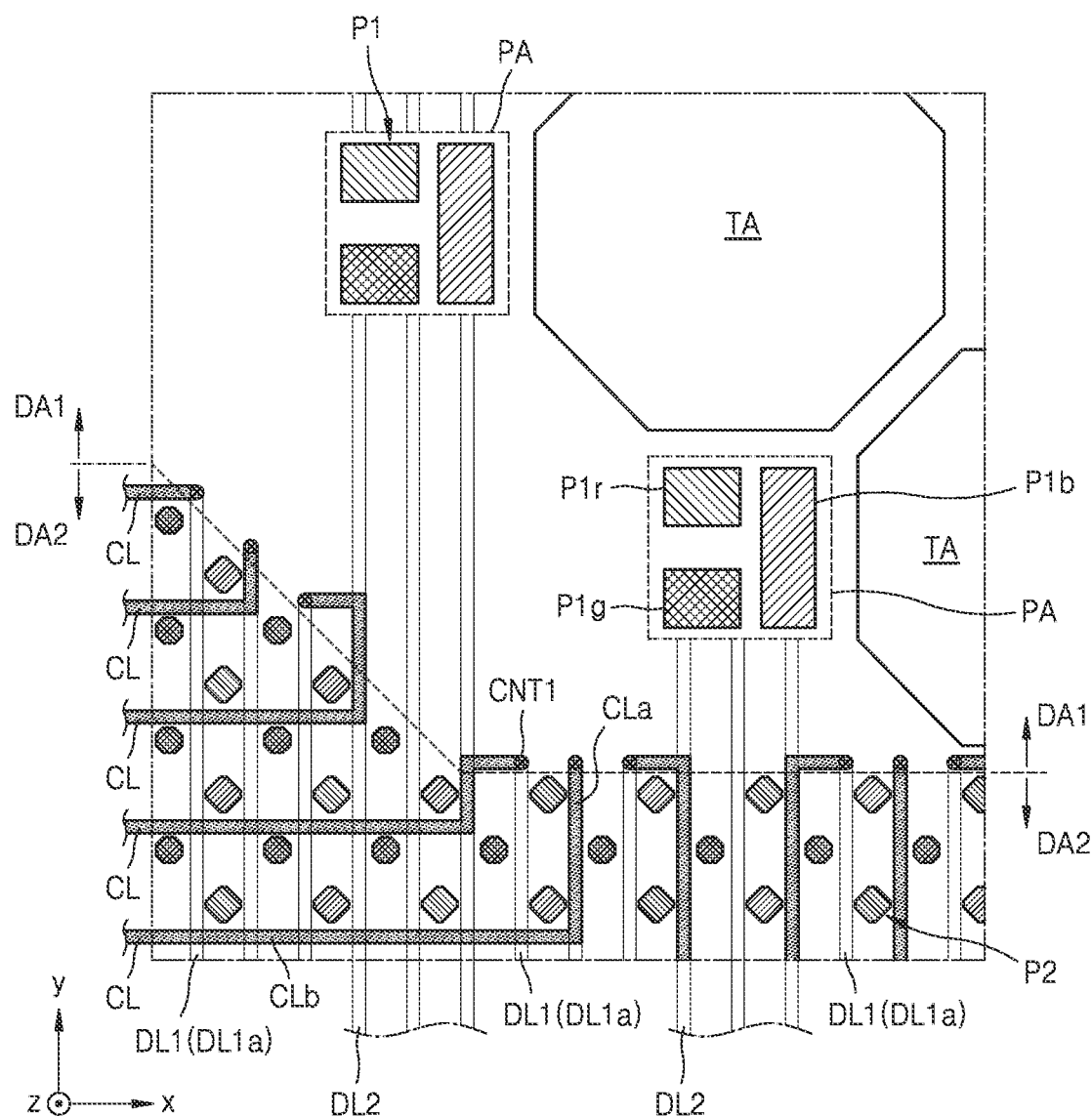
FIGS. 15 and 16 are schematic plan views of portions of a display apparatus according to some embodiments, the portions corresponding to region E and region F of FIG. 3, respectively.
Figure 16:
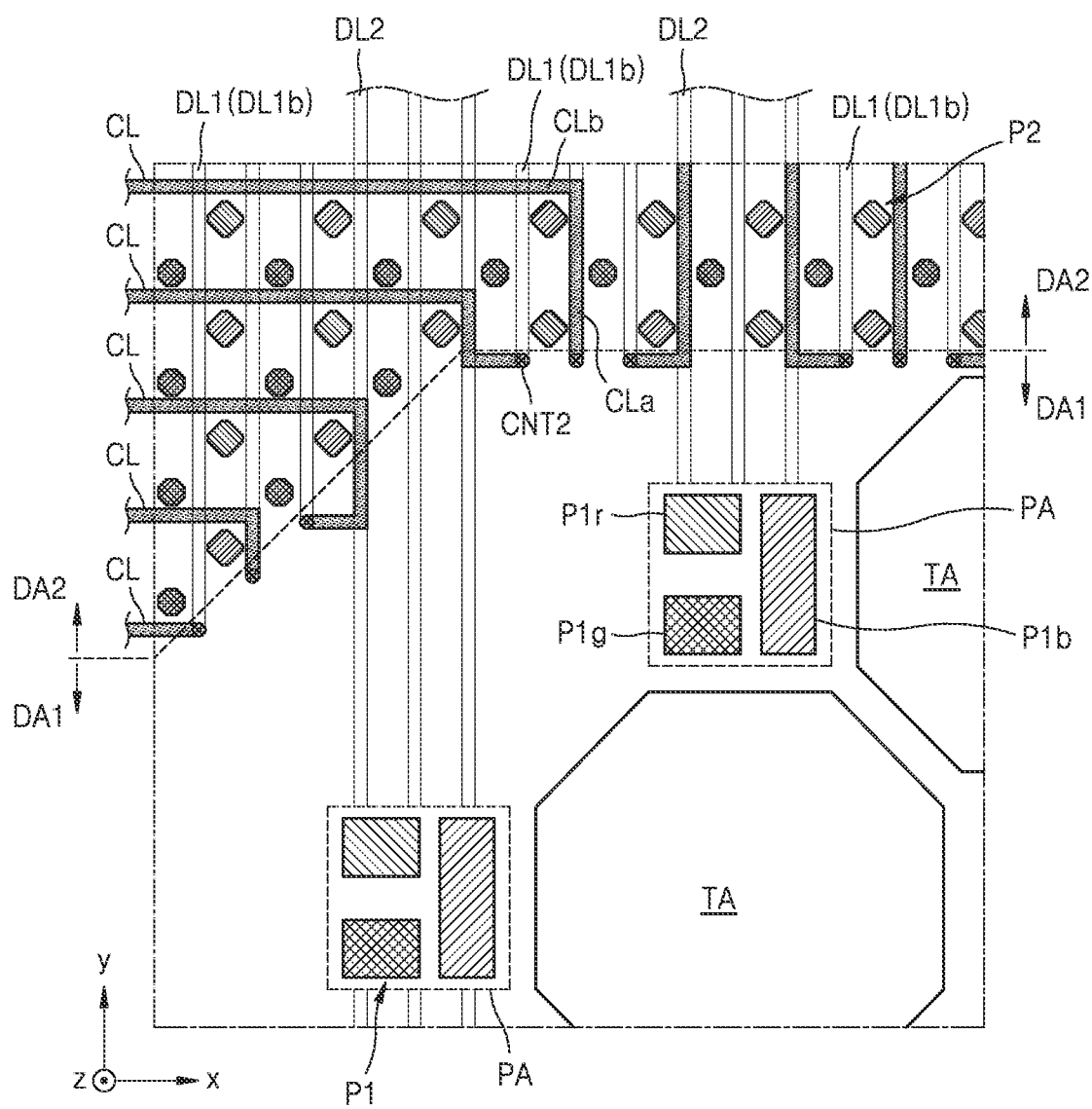

FIGS. 15 and 16 are schematic plan views of a portion of the display apparatus 1 according to some embodiments. FIGS. 15 and 16 illustrate, in detail, a connection structure of lines at an edge between the first area D1 and the second area D2, and respectively correspond to regions E and F of FIG. 3.

Referring to FIGS. 15 and 16, the first pixel P1 may be arranged in the first area DA1, and the second pixel P2 may be arranged in the second area DA2. According to some embodiments, the first pixel P1 and the second pixel P2 may be differently provided. As illustrated in FIGS. 15 and 16, an emission area of the first pixel P1 may be greater than an emission area of the second pixel P2. The first area DA1 may have the transmission portion TA, and thus, a fewer number of pixels may be arranged in the first area DA1 than in the second area DA2. Thus, to compensate for the brightness of the first area DA1, the emission area of the first pixel P1 may be greater than the emission area of the second pixel P2.

In the first area DA1, the plurality of pixel areas PA and the plurality of transmission portions TA may be alternately arranged, and the first pixel P1 may be arranged to correspond to each of the pixel areas PA. According to some embodiments, a plurality of first pixels P1r, P1g, and P1b may be arranged in the pixel area PA, and the plurality of first pixels P1r, P1g, and P1b may emit any one of red, green, and blue light.

As illustrated in FIG. 15, the first data line DL1 and the second data line DL2 may extend on the second area DA2 toward the first area DA1 in a first direction (for example, a y direction). Of the first and second data lines DL1 and DL2, the first data line DL1 might not be arranged on the first area DA1, and may be disconnected with the first area DA1 therebetween. Accordingly, the first data line DL1 may include the first line DL1a arranged below the first area DA1 and the second line DL1b arranged above the first area DA1.

An end of the connection line CL may be connected to the first line DL1a through the first contact hole CNT1, and the other end of the connection line CL may be connected to the second line DL1b through the second contact hole CNT2, as illustrated in FIG. 15. The first contact hole CNT1 and the second contact hole CNT2 may be located in an edge portion of the first area DA1. The edge portion of the first area DA1 may correspond to a non-display area, in which the pixel area PA and the transmission portion TA are not arranged, and the connection line CL and the first data line DL1 may be connected to each other through this edge portion of the first area DA1.

A portion of the connection line CL, the portion extending in the first direction (for example, the y direction), may be referred to as a first portion CLa, and a portion of the connection line CL, the portion extending in the second direction (for example, the x direction), may be referred to as a second portion CLb. Here, two second pixels P2 may be arranged in the second direction (for example, the x direction) between adjacent first portions CLa. Thus, portions of the connection line CL may have an end and the other end, which are bent to be connected to the first contact hole CNT1 and the second contact hole CNT2, so as to be connected to the first data line DL1.

The second data line DL2 may extend on the second area DA1 toward the first area DA1 as illustrated in FIG. 15, or may extend on the first area DA1 toward the second area DA2 as illustrated in FIG. 16. That is, the second data line DL2 may not be disconnected on the first area DA1 and may be continually formed. The second data line DL2 may be connected not only to the second pixel P2 in the second area DA2, but also to the first pixel P1 in the first area DA1, so as to transmit data signals.

FIGS. 15 and 16 illustrate that the first data line DL1 and the second data line DL2 each including three data lines are alternately arranged. However, the disclosure is not limited thereto.

The descriptions above are mainly given with respect to a display apparatus. However, the disclosure is not limited thereto. That is, a method of manufacturing the display apparatus may also be included in the scope of the disclosure.

According to the one or more of the embodiments described above, a display apparatus may be realized to have a display area, which is enlarged to display an image in an area in which a component is arranged. However, the scope of the disclosure is not limited thereto.

It should be understood that embodiments described herein should be considered in a descriptive sense only and not for purposes of limitation. Descriptions of features or aspects within the embodiments should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A display apparatus comprising:
    a first area comprising a first pixel and a transmission portion;
    a second area comprising a second pixel and a third pixel, and surrounding the first area;
    a first data line configured to apply a data signal to a first subpixel of the first pixel and a first subpixel of the second pixel and arranged in the first area and the second area to extend in a first direction, the first subpixel of the first pixel and the first subpixel of the second pixel being arranged in the first direction;
    a second data line configured to apply a data signal to a second subpixel of the third pixel and a third subpixel of the third pixel, the second data line being arranged in the first direction in the second area and disconnected in the first area; and
    a connection line arranged in the second area and comprising a first part extending in a second direction crossing the first direction, a second part connected to the first part and extending in the first direction, and a third part connected to the second part and extending in the second direction,
    wherein the connection line is connected to the second date line.

2. The display apparatus of claim 1, wherein the first subpixel of the first pixel and the first subpixel of the second pixel are configured to emit a same color.

3. The display apparatus of claim 1, wherein the second subpixel of the third pixel and the third subpixel of the third pixel are configured to emit different colors.

4. The display apparatus of claim 1, wherein the first data line and the second data line are spaced from each other in the second direction.

5. The display apparatus of claim 1, wherein
    the second subpixel of the third pixel comprises a second pixel electrode,
    the third subpixel of the third pixel comprises a third pixel electrode, and
    the connection line does not overlap with the second pixel electrode and the third pixel electrode in a plan view.

6. The display apparatus of claim 1, wherein the connection line is arranged in a different layer from the second data line.

7. The display apparatus of claim 1, wherein
    each of the first subpixel of the first pixel and the first subpixel of the second pixel comprises a first pixel electrode,
    an area of the first pixel electrode of the first subpixel of the first pixel is larger than an area of the first pixel electrode of the first subpixel of the second pixel.

8. The display apparatus of claim 7, wherein
    the second subpixel of the third pixel comprises a second pixel electrode,
    the third subpixel of the third pixel comprises a third pixel electrode, and
    the area of the first pixel electrode of the first subpixel of the first pixel is larger than an area of each of the second pixel electrode and third pixel electrode.

9. The display apparatus of claim 1, wherein the connection line comprises at least one bent portion.

10. A display apparatus comprising:
    a first area comprising a first pixel and a transmission portion;

a second area comprising a second pixel and a third pixel, and surrounding the first area;

a first data line configured to apply a data signal to a first subpixel of the first pixel and a first subpixel of the second pixel and arranged in the first area and the second area to extend in a first direction, the first subpixel of the first pixel and the first subpixel of the second pixel being arranged in the first direction;

a second data line configured to apply a data signal to a second subpixel of the third pixel and a third subpixel of the third pixel, the second data line being arranged in the first direction in the second area and comprising a first wire and a second wire, which are spaced from each other in the first direction with the first area therebetween; and a connection line comprising a first part connected to the first wire, a second part connected to the second wire, and a third part connecting the first part and the second part between the first part and the second part, wherein at least a portion of the third part of the connection line is arranged in the second area to extend in the first direction.

11. The display apparatus of claim 10, wherein the first subpixel of the first pixel and the first subpixel of the second pixel are configured to emit a same color.

12. The display apparatus of claim 10, wherein the second subpixel of the third pixel and the third subpixel of the third pixel are configured to emit different colors.

13. The display apparatus of claim 10, wherein the first data line and the second data line are spaced from each other in a second direction crossing the first direction.

14. The display apparatus of claim 10, wherein the second subpixel of the third pixel comprises a second pixel electrode, the third subpixel of the third pixel comprises a third pixel electrode, and the connection line does not overlap with the second pixel electrode and the third pixel electrode in a plan view.

15. The display apparatus of claim 10, wherein the connection line is arranged in a different layer from the second data line.

16. The display apparatus of claim 10, wherein each of the first subpixel of the first pixel and the first subpixel of the second pixel comprises a first pixel electrode, an area of the first pixel electrode of the first subpixel of the first pixel is larger than an area of the first pixel electrode of the first subpixel of the second pixel.

17. The display apparatus of claim 10, wherein the connection line comprises at least one bent portion.

18. A display apparatus comprising:

a first area comprising a first pixel and a transmission portion;

a second area surrounding the first area;

a second pixel and a third pixel arranged in the second area;

a fourth pixel arranged in the second area and spaced from the third pixel with the first area therebetween;

a first data line configured to apply a data signal to the first pixel and the second pixel and arranged in the first area and the second area to extend in a first direction;

a second data line configured to apply a data signal to the third pixel and the third pixel, the second data line being arranged in the first direction in the second area and comprising a first wire connected to the third pixel and a second wire connected to the fourth pixel; and a connection line arranged in the second area, and comprising a first part connected to the first wire, a second part connected to the second wire, and a third part connecting the first part and the second part between the first part and the second part, wherein the connection line is arranged in a different layer from the second data line.

19. The display apparatus of claim 18, wherein the connection line is connected to the second data line through a contact hole defined in an insulating layer between the connection line and the second data line.

20. The display apparatus of claim 18, wherein a resolution of the first area is lower than a resolution of the second area.

\* \* \* \* \*